United States Patent
Homma et al.

(10) Patent No.: US 10,354,977 B2
(45) Date of Patent: Jul. 16, 2019

(54) SEMICONDUCTOR DEVICE AND MANUFACTURING METHOD THEREOF

(71) Applicant: TOSHIBA MEMORY CORPORATION, Minato-ku (JP)

(72) Inventors: Soichi Homma, Yokkaichi (JP); Masatoshi Fukuda, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/702,055

(22) Filed: Sep. 12, 2017

(65) Prior Publication Data

US 2018/0277515 A1    Sep. 27, 2018

(30) Foreign Application Priority Data

Mar. 22, 2017 (JP) ................... 2017-056234

(51) Int. Cl.
*H01L 21/78* (2006.01)
*H01L 23/00* (2006.01)
(Continued)

(52) U.S. Cl.
CPC ...... *H01L 25/0657* (2013.01); *H01L 21/6835* (2013.01); *H01L 21/6836* (2013.01); *H01L 21/78* (2013.01); *H01L 23/3135* (2013.01); *H01L 23/544* (2013.01); *H01L 23/562* (2013.01); *H01L 25/50* (2013.01);
(Continued)

(58) Field of Classification Search
CPC . H01L 2224/32225; H01L 2224/73204; H01L 2224/32145; H01L 2224/97; H01L 2924/15311; H01L 25/0657
See application file for complete search history.

(56) References Cited

U.S. PATENT DOCUMENTS 8,263,434 B2    9/2012 Pagaila et al.
8,268,704 B2    9/2012 Fujii et al.
(Continued)

FOREIGN PATENT DOCUMENTS

JP    2010-245384    10/2010
TW    200306622 A    11/2003
(Continued)

*Primary Examiner* — Zandra V Smith
*Assistant Examiner* — John M Parker
(74) *Attorney, Agent, or Firm* — Oblon, McClelland, Maier & Neustadt, L.L.P.

(57) ABSTRACT

A device includes a wiring substrate. A first semiconductor-chip has a first face, a second face, and a first side face between an outer edge of the first face and an outer edge of the second face, where the first side face is a first condition plane. The first semiconductor-chip is located above the wiring substrate. A second semiconductor-chip has a third face, a fourth face, a second side face between an outer edge of the third face and an outer edge of the fourth face, and a through electrode passing through at least a semiconductor substrate between the third face and the fourth face. The second side face is the first condition plane and a second condition plane having more irregularities than the first condition plane. The second semiconductor-chip is located between the wiring substrate and the first semiconductor-chip. The resin is located around the first and second semiconductor-chips.

17 Claims, 25 Drawing Sheets

(51) Int. Cl.
*H01L 23/31* (2006.01)
*H01L 25/00* (2006.01)
*H01L 21/683* (2006.01)
*H01L 23/544* (2006.01)
*H01L 25/065* (2006.01)

(52) U.S. Cl.
CPC .. *H01L 23/3128* (2013.01); *H01L 2221/6834* (2013.01); *H01L 2221/68327* (2013.01); *H01L 2221/68381* (2013.01); *H01L 2223/5446* (2013.01); *H01L 2224/16145* (2013.01); *H01L 2224/16225* (2013.01); *H01L 2225/06513* (2013.01); *H01L 2225/06541* (2013.01); *H01L 2225/06575* (2013.01); *H01L 2225/06582* (2013.01); *H01L 2924/15311* (2013.01); *H01L 2924/181* (2013.01)

(56) References Cited

U.S. PATENT DOCUMENTS

| | | | |
|---|---|---|---|
| 8,294,281 B2 | 10/2012 | Yoshida et al. | |
| 8,653,676 B2 | 2/2014 | Kim et al. | |
| 9,224,647 B2 | 12/2015 | Koo et al. | |
| 2013/0161813 A1* | 6/2013 | Miki | H01L 23/49811 257/737 |
| 2014/0252632 A1* | 9/2014 | Barth | H01L 23/5384 257/773 |
| 2014/0307997 A1 | 10/2014 | Bar et al. | |
| 2014/0377886 A1* | 12/2014 | Koyanagi | H01L 25/50 438/5 |
| 2015/0108506 A1* | 4/2015 | Zhang | H01L 31/18 257/81 |
| 2015/0179623 A1* | 6/2015 | Ono | H01L 25/50 438/107 |
| 2015/0371970 A1* | 12/2015 | Sakurada | H01L 24/97 257/737 |
| 2016/0020190 A1* | 1/2016 | Wu | H01L 21/6835 438/113 |
| 2016/0141273 A1* | 5/2016 | Tsuji | H01L 23/544 257/737 |
| 2016/0329304 A1* | 11/2016 | Hatakeyama | H01L 24/97 |
| 2017/0098622 A1* | 4/2017 | Park | H01L 23/49811 |
| 2018/0006006 A1* | 1/2018 | Kim | H01L 23/3185 |

FOREIGN PATENT DOCUMENTS

| | | |
|---|---|---|
| TW | 201104797 A1 | 2/2011 |
| TW | 201246482 A1 | 11/2012 |
| TW | 201320259 A1 | 5/2013 |
| TW | 201342587 A | 10/2013 |

* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2017-056234, filed on Mar. 22, 2017, the entire contents of which are incorporated herein by reference.

FIELD

The embodiments of the present invention relate to a semiconductor device and manufacturing method thereof.

BACKGROUND

Semiconductor devices such as a semiconductor memory are manufactured by staking a plurality of thinned semiconductor chips and packaging the stacked semiconductor chips with a resin in some cases. When a semiconductor wafer is diced with a blade to be singulated into semiconductor chips, many irregularities arise on the side faces of the semiconductor chips, resulting in crushed layers. When thermal treatment (reflow) for connecting bumps or the like or thermal treatment (reflow) for mounting a package is performed to a semiconductor chip having such a crushed layer on the side face, the package or the semiconductor chip warps, which leads to a crack starting from the crushed layer on the end of the package.

When a semiconductor chip having a though electrode (TSV (Through Silicon Via)) is thinned, blade dicing may break the semiconductor chip, cause chipping thereof, or produce a poor appearance due to swarf of silicon or the like.

DETAILED DESCRIPTION

A semiconductor device includes a wiring substrate. A first semiconductor chip has a first face, a second face on an opposite side to the first face, and a first side face between an outer edge of the first face and an outer edge of the second face, where the first side face is a first condition plane. The first semiconductor chip is located above the wiring substrate. A second semiconductor chip has a third face, a fourth face on an opposite side to the third face, a second side face between an outer edge of the third face and an outer edge of the fourth face, and a through electrode passing through at least a semiconductor substrate between the third face and the fourth face. The second side face is the first condition plane and a second condition plane having more irregularities than the first condition plane. The second semiconductor chip is located between the wiring substrate and the first semiconductor chip. The resin is located around the first and second semiconductor chips.

Embodiments will now be explained with reference to the accompanying drawings. The present invention is not limited to the embodiments. In the embodiments, the term "upper direction" or "lower direction" of a semiconductor substrate or a wiring substrate indicates a direction regarding a face on which semiconductor elements are provided as an upper face in some cases, and indicates a direction regarding a face to which dicing is performed as an upper face in other cases. Further, the term "upper direction" or "lower direction" of a semiconductor substrate or a wiring substrate occasionally differs from an upper direction or a lower direction based on a gravitational acceleration direction.

First Embodiment

Figure 1:
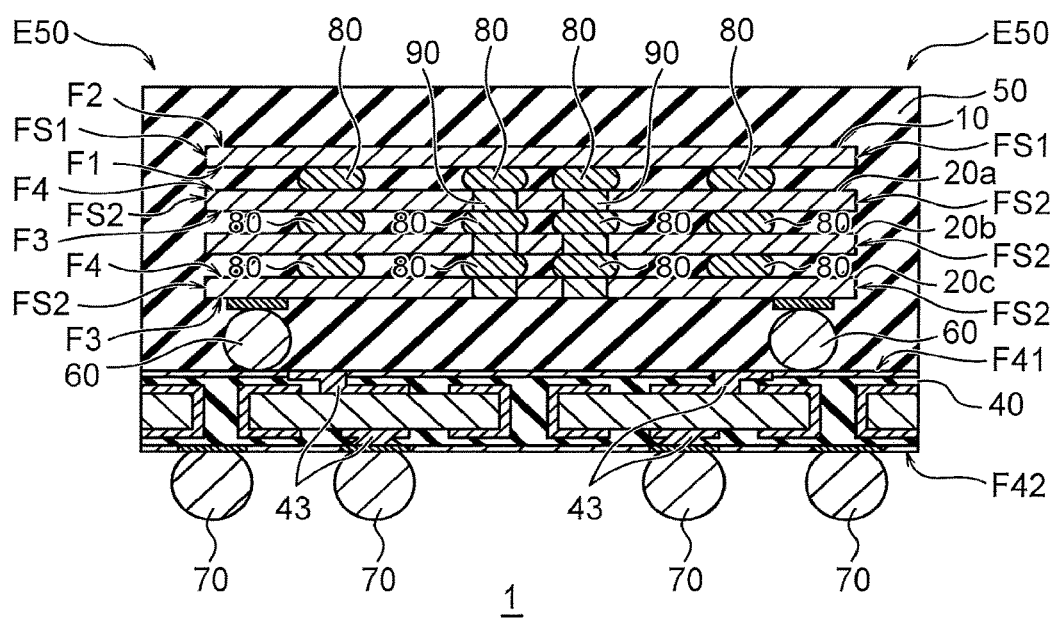
FIG. 1 is a sectional view illustrating a configuration example of a semiconductor device according to a first embodiment.

FIG. 1 is a sectional view illustrating a configuration example of a semiconductor device according to a first embodiment. A semiconductor device 1 is, for example, a semiconductor memory such as a NAND EEPROM (Electrically Erasable and Programmable Read-Only-Memory). In this case, a first semiconductor chip 10 and second semiconductor chips 20a to 20c are, for example, semiconductor memory chips each having a memory cell array.

The semiconductor device 1 includes the first semiconductor chip 10, the second semiconductor chips 20a, 20b, and 20c, a wiring substrate 40, a resin 50, metal bumps 60, and metal balls 70.

The first semiconductor chip 10 has a first face F1, a second face F2, and a first side face FS1. For example, a silicon substrate thinned to be equal to or less than about 50 micrometers is used as the first semiconductor chip 10. Semiconductor elements (not illustrated) are formed on the first face F1 of the first semiconductor chip 10. The semiconductor elements are elements that can be formed on the silicon substrate, such as a memory cell array, a transistor, a resistor element, and a capacitor element. The second face F2 is located on the opposite side of the first semiconductor chip 10 to the first face F1. The first side face FS1 is a side face connecting the outer edge of the first face F1 and the outer edge of the second face F2.

The first side face FS1 is a cleavage plane (a first condition plane) of the silicon substrate and is a crystal plane of a silicon single crystal. Therefore, the first side face FS1 is a mirror plane containing few irregularities. That is, the first side face FS1 is a smooth face having almost no crushed plane caused by blade dicing or modified plane caused by laser dicing. The cleavage plane has a same crystal plane of a silicon single crystal, entirely.

For example, in blade dicing, a blade mechanically cuts a semiconductor wafer. Therefore, the side faces of semiconductor chips singulated by the blade dicing have crushed planes including many irregularities. Furthermore, in laser dicing, for example, laser cuts a semiconductor wafer while modifying the semiconductor wafer. Therefore, the side faces of semiconductor chips singulated by the laser dicing have modified planes. A modified plane is a plane made of, for example, amorphous silicon or polysilicon which is a material obtained by modifying silicon single crystals. The modified plane is a second condition plane having more irregularities than the first condition plane.

The first semiconductor chip 10 according to the present embodiment is obtained by forming a modified layer in a semiconductor wafer by laser dicing, then polishing the semiconductor wafer to a position deeper than the modified layer, and singulating the semiconductor wafer into chips, as described later. Accordingly, the first side face FS1 of the first semiconductor chip 10 becomes a cleavage plane containing almost no crushed plane or modified plane as described above. A silicon dioxide film may be formed as a natural oxide film on the first side face FS1.

The first semiconductor chip 10 is stacked on the stacked second semiconductor chips 20a to 20c. The first semiconductor chip 10 is electrically connected to semiconductor elements or the like on the second semiconductor chip 20a via the metal bumps 80. The metal bumps 80 are provided on a fourth face F4 of the second semiconductor chip 20a or the first face F1 of the first semiconductor chip 10. In the present embodiment, the metal bumps 80 are provided on the fourth face F4 of the second semiconductor chip 20a. For example, a metal such as Sn, Ag, Cu, Au, Bi, Zn, In, Ni, or Ge, or a material such as a composite membrane or alloy including two or more of these metals is used for the metal bumps 80.

Each of the second semiconductor chips 20a, 20b, and 20c has a third face F3, the fourth face F4, and a second side face FS2. For example, a silicon substrate thinned to be equal to or less than about 50 micrometers is used also for the second semiconductor chips 20a, 20b, and 20c. The second semiconductor chips 20a, 20b, and 20c can have the same structure. Although not illustrated, a redistribution layer (RDL) can be provided on the third face F3 of the second semiconductor chip 20c. A metal such as Al, Cu, Au, Ag, Ni, Pd, Ti, TiN, Ta, TaN, W, or WN, or a material such as a composite membrane or alloy including two or more of these metals is used for the RDL. Semiconductor elements (not illustrated) are formed on the third face F3 of each of the second semiconductor chips 20a, 20b, and 20c similarly on the first face F1 of the first semiconductor chip 10. The fourth face F4 is located on the opposite side of each of the second semiconductor chips 20a, 20b, and 20c to the third face F3. The second side face FS2 is a side face connecting the outer edge of the third face F3 and the outer edge of the fourth face F4.

The second side face FS2 of each of the second semiconductor chips 20a, 20b, and 20c is a face including both a cleavage plane and a modified plane of the silicon substrate. That is, the second side face FS2 has a layer of a cleavage plane and a layer of a modified plane. Therefore, a modified layer caused by laser dicing remains on the second side face FS2.

A semiconductor wafer is singulated into the second semiconductor chips 20a, 20b, and 20c according to the present embodiment by polishing the semiconductor wafer, then forming a modified layer in the semiconductor wafer by laser dicing, and cleaving the semiconductor wafer as described later. Accordingly, the second side face FS2 of each of the second semiconductor chips 20a, 20b, and 20c becomes a face having both the cleavage plane and the modified plane as described above. A silicon dioxide film as a natural oxide film may be formed on the second side face FS2. The modified plane is explained in more detail with reference to FIGS. 2A and 2B.

Each of the second semiconductor chips 20a, 20b, and 20c has the metal bumps 80 on the fourth face F4. For example, a metal such as Sn, Ag, Cu, Au, Bi, Zn, In, Ni, or Ge, or a material such as a composite membrane or alloy including two or more of these metals is used for the metal bumps 80. The second semiconductor chip 20a is electrically connected to the semiconductor elements or the like on the first face F1 of the first semiconductor chip 10 via the metal bumps 80 on the fourth face F4 of the second semiconductor chip 20a. The second semiconductor chip 20b is electrically connected to the semiconductor elements or the like on the second semiconductor chip 20a via the metal bumps 80 on the fourth face F4 of the second semiconductor chip 20b. The second semiconductor chip 20c is electrically connected to the semiconductor elements or the like on the second semiconductor chip 20b via the metal bumps 80 on the fourth face 4 of the second semiconductor chip 20c.

While the first semiconductor chip 10 has no TSV, each of the second semiconductor chips 20a to 20c has TSVs 90 being through electrodes. The TSVs 90 pass through between the third face F3 and the fourth face F4 of each of the second semiconductor chips 20a to 20c and electrically connect the semiconductor elements or the like on the third face F3 to the metal bumps 80 located on the side of the fourth face F4. While details are explained later, the TSVs 90 can be through electrodes passing through at least the silicon substrate of the semiconductor wafer. Provision of the TSVs 90 eliminates the need of wire bonding, which leads to downscaling of the semiconductor device. A metal such as Al, Cu, Au, Ag, Ni, Pd, Ti, TiN, Ta, TaN, W, or WN, or a material such as a composite membrane or alloy including two or more of these metals is used as an example of the TSVs 90 being through electrodes.

The wiring substrate 40 has a front face F41, a back face F42, and metal wires 43 provided inside the wiring substrate 40. The second semiconductor chip 20c is electrically connected to any of the metal wires 43 of the wiring substrate 40 via the metal bumps 60. An organic resin substrate, a ceramic substrate, glass, silicon, or the like is used as the wiring substrate 40. The wiring substrate 40 is electrically connected further to the metal balls 70 via the metal wires 43. The metal balls 70 electrically connect an external device to the first and second semiconductor chips 10 and 20a to 20c. The resin 50 seals the stacked first and second semiconductor chips 10 and 20a to 20c. With the resin 50, the first and second semiconductor chips 10 and 20a to 20c are packaged on the wiring substrate 40.

While the three second semiconductor chips are stacked in the present embodiment, the number of the second semiconductor chips is not limited thereto. Two or less second semiconductor chips, or four or more second semiconductor chips can be stacked.

Figure 2A:
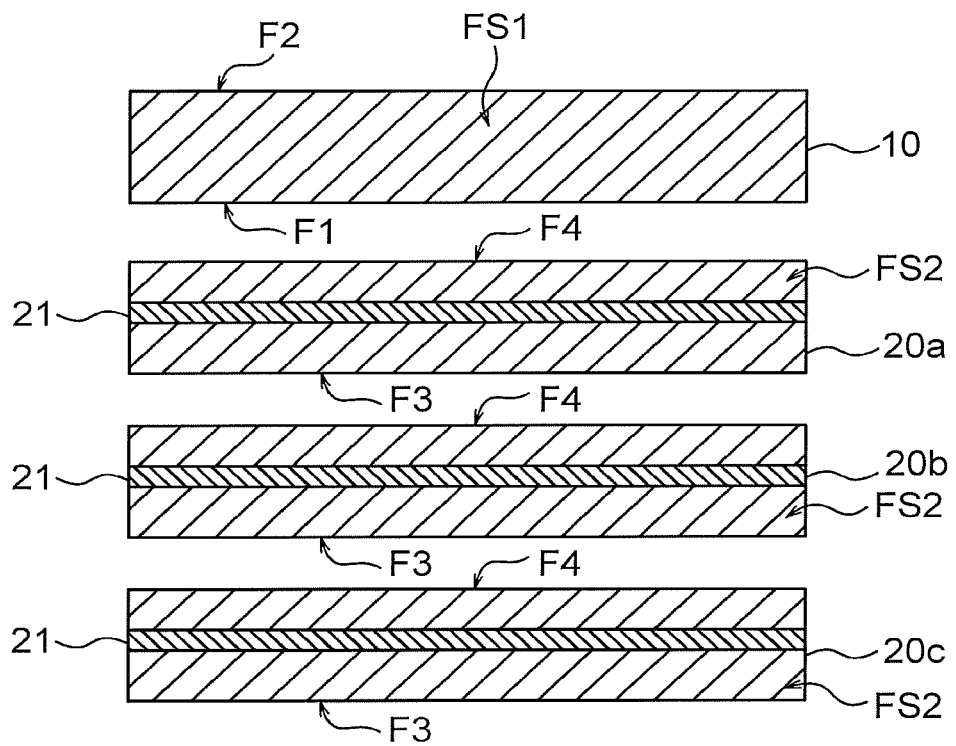
FIGS. 2A and 2B are schematic side views illustrating the first semiconductor chip and the second semiconductor chips.
Figure 2B:
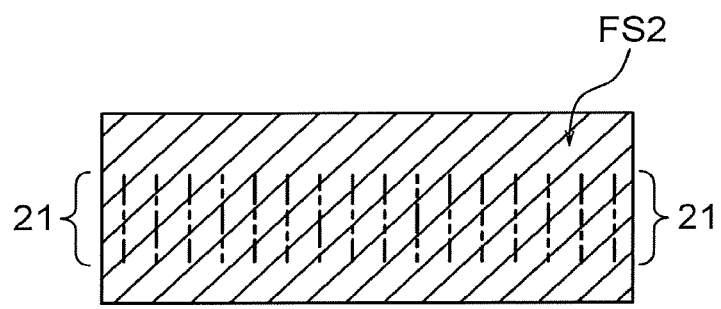

FIGS. 2A and 2B are schematic side views illustrating the first semiconductor chip 10 and the second semiconductor chips 20a to 20c. Illustrations of semiconductor elements, an interlayer dielectric film, a wiring layer, and metal bumps are omitted in FIGS. 2A and 2B.

The first side face FS1 of the first semiconductor chip 10 is a cleavage plane. The second side face FS2 of each of the second semiconductor chips 20a to 20c has a modified plane 21 in the middle of a cleavage plane. The modified plane 21 is provided over the second side face FS2 on four sides of each of the second semiconductor chips 20a to 20c. That is, the modified plane 21 is provided to surround each of the second semiconductor chips 20a to 20c.

FIG. 2B is an enlarged view of the modified plane 21. The modified plane 21 is provided in the form of a layer in a middle part of the second side surface FS2. The modified plane 21 is a plane of amorphous silicon or polysilicon, or an oxide film of amorphous silicon or polysilicon as described above, and is a rough plane having more irregularities than a cleavage plane of a silicon crystal. Meanwhile, the irregularities of the modified plane 21 are smaller than those of a crushed plane caused by blade dicing.

The semiconductor chips having the TSVs 90 are thinned to be equal to or less than 50 micrometers, for example. Therefore, the semiconductor chips 10 and 20a to 20c easily warp although they are stacked. If the stacked semiconductor chips warp, cracks starting from a crushed plane including many irregularities are likely to occur on the semiconductor chips 10 and 20a to 20c and the package as described above. Furthermore, also when heat of reflow or the like is applied during assembly, the stacked body may warp to cause cracks on the semiconductor chips 10 and 20a to 20c. These cracks due to warp of the chips become noticeable particularly when semiconductor chips having through electrodes are stacked vertically.

The first semiconductor chip 10 according to the present embodiment is stacked on the stacked second semiconductor chips 20a, 20b, and 20c and is located in the uppermost layer farthest from the wiring substrate 40. Therefore, the first side face FS1 of the first semiconductor chip 10 is nearer an end E50 of the resin 50 of the semiconductor device 1 than the second side faces FS2 of the second semiconductor chips 20a, 20b, and 20c. Because of the first side face FS1 of the first semiconductor chip 10 having the cleavage plane with no irregularities, cracks are less likely to occur on the semiconductor chips 10 and 20a to 20c and the package even if the stacked body of the semiconductor chips 10 and 20a to 20c warps. Furthermore, also when heat of reflow or the like is applied to the stacked body during the assembly and the stacked body warps, cracks are less likely to occur on the semiconductor chips 10 and 20a to 20c. Because no through electrodes are formed in the first semiconductor chip 10, there is an advantage that the chip is not easily broken and cracks do not easily occur on the chip even if the chip warps. The second semiconductor chips 20a to 20c are stacked under the first semiconductor chip 10 and are farther from the end E50 than the first semiconductor chip 10. Therefore, even if the second side face FS2 of each of the second semiconductor chips 20a to 20c has a modified plane including some irregularities, the modified plane is less likely to become a starting point of cracks. If the entire second side faces FS2 of the second semiconductor chips 20a to 20c are smooth cleavage planes similarly to the first side face FS1 of the first semiconductor chip 10, the resin 50 easily peels from the second side faces FS2 and may become a factor of a defect. Therefore, provision of the modified plane as well as the cleavage plane on the second side face FS2 of each of the second semiconductor chips 20a to 20c can provide higher adhesiveness between the resin 50 and the second side faces FS2. This is because adhesion with the resin is improved due to the fact that the modified plane includes irregularities and that the modified plane is a plane of amorphous silicon or polysilicon, or an oxide film of amorphous silicon or polysilicon. It is preferable that the modified plane be in a range not less than 5% and not more than 80% of the surface area of the second side face FS2. Poor adhesion with the resin may occur if the modified plane is less than 5% of the surface area, and cracks may occur due to stress of warp or the like if the modified plane exceeds 80% of the surface area.

It is also preferable for suppression of cracks that the distance from the chip side face to the through electrodes be equal to or larger than 50 micrometers. If the distance is smaller than 50 micrometers, the distance from the modified plane to the through electrodes is small and thus cracks are likely to occur.

For example, a temperature cycle test was performed to the semiconductor device 1 according to the present embodiment. In the temperature cycle test, cycles in which the semiconductor device 1 is exposed to an atmosphere at −55° C. for 30 minutes, to an atmosphere at 25° C. for 5 minutes, and to an atmosphere at 125° C. for 30 minutes are repeatedly performed. As a result, defects such as peel of the resin 50, cracks of the resin 50, or break of the first and second semiconductor chips 10 and 20a to 20c did not occur near the first side face FS1 and the second side faces FS2 even after 3000 cycles.

As described above, according to the present embodiment, the first side face FS1 of the first semiconductor chip 10 is entirely formed as a cleavage plane and a modified plane is provided on each of the second side faces FS2 of the second semiconductor chips 20a to 20c, whereby cracks of the resin (package) 50 or the semiconductor chips 10 and 20a to 20c can be suppressed and the adhesiveness between the resin 50 and the semiconductor chips 10 and 20a to 20c can be improved.

A manufacturing method of the semiconductor device 1 according to the first embodiment is explained next.

FIGS. 3A to 13B are perspective views or sectional views illustrating an example of the manufacturing method of the semiconductor device according to the first embodiment.

Manufacturing Method of First Semiconductor Chip 10

Figure 3A:
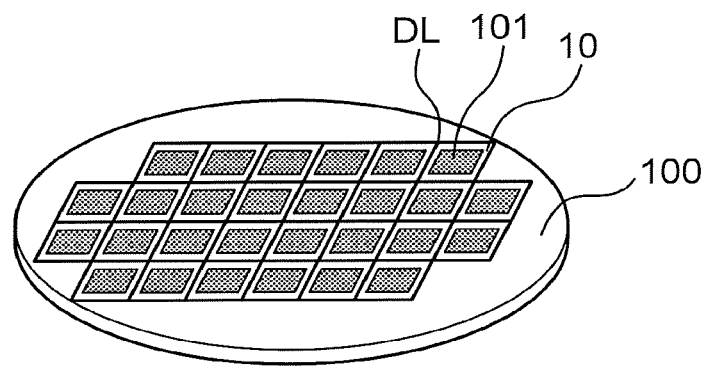
FIGS. 3A to 13B are perspective views or sectional views illustrating an example of the manufacturing method of the semiconductor device according to the first embodiment.

First, as illustrated in FIG. 3A, semiconductor elements (not illustrated) are formed on a first semiconductor wafer 100. An interlayer dielectric film and a wiring layer 101 are provided on the semiconductor elements. There are dicing lines DL between a plurality of first semiconductor chips 10 and the semiconductor wafer 100 is cut at the dicing lines DL to be singulated into the first semiconductor chips 10 as described later.

Electrode pads (not illustrated) are formed on the surface of each of the first semiconductor chips 10. For example, a metal such as Al, Cu, Au, Ni, Pd, Ti, TiN, Ta, TaN, W, or WN, or a composite membrane or alloy including two or more of these metals is used for the electrode pads. In the present embodiment, no metal bumps are provided on the electrode pads of the first semiconductor chip 10. However, metal bumps can be provided on the electrode pads. In this case, a metal such as Sn, Ag, Cu, Au, Bi, Zn, In, Ni, or Ge, or a composite membrane or alloy including two or more of these metals can, for example, be used for the metal bumps.

Figure 3B:
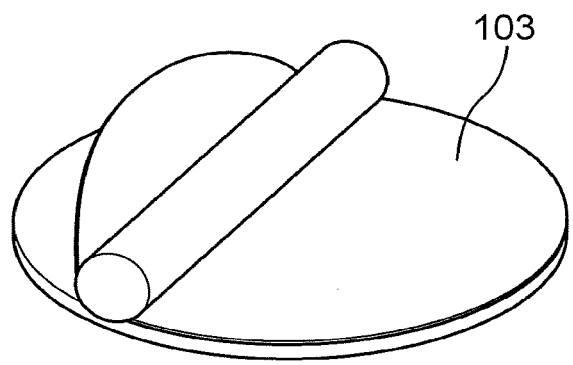

Next, a protection tape 103 is stuck on the front surface of the first semiconductor wafer 100 as illustrated in FIG. 3B.

Figure 3C:
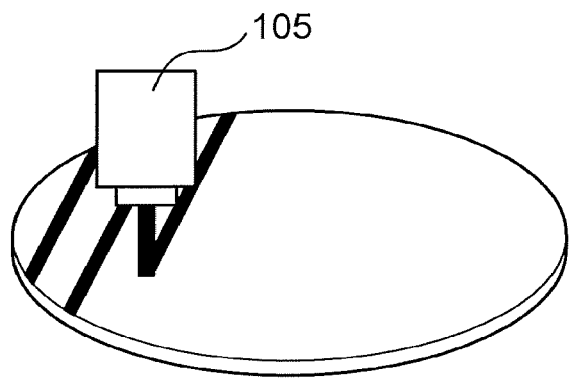
Figure 4:
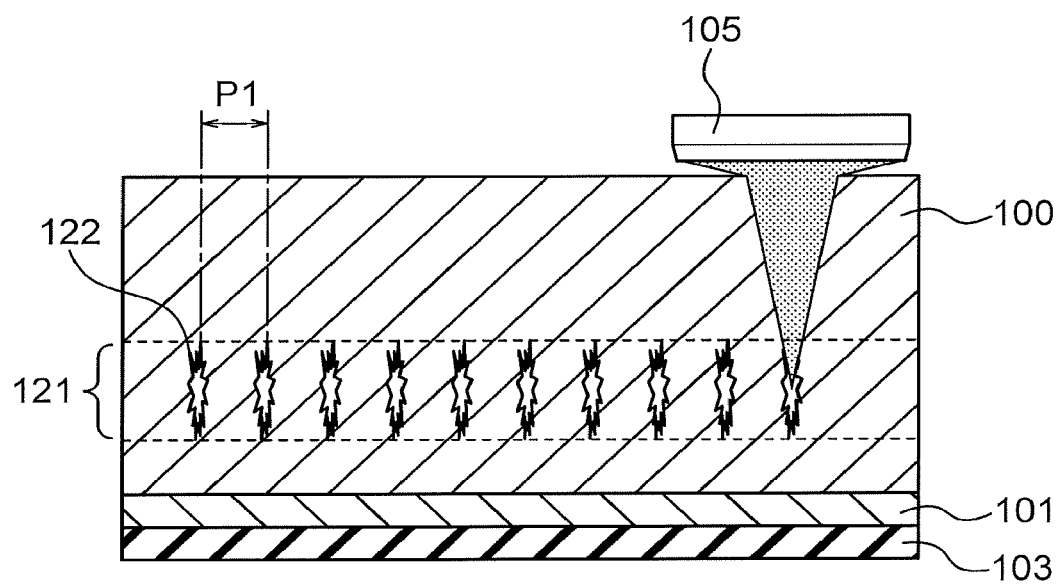

Subsequently, laser is irradiated to portions corresponding to the dicing lines DL on the back surface of the first semiconductor wafer 100 using a laser oscillator 105 as illustrated in FIG. 3C. In this way, a modified layer (amorphous layer or polysilicon layer) 121 is formed in an inner part of the first semiconductor wafer 100 (an inner part of a silicon substrate) as illustrated in FIG. 4. FIG. 4 is a sectional view of a portion along the dicing line in FIG. 3C. The laser oscillator 105 brings the laser into focus at an arbitrary depth position in the silicon substrate. The laser preferably has a wavelength not shorter than 800 nanometers and not longer than 3000 nanometers to enable silicon single crystals to be modified. With a wavelength shorter than 800 nanometers, the possibility of the laser absorbed in the inner part of silicon is increased and formation of a modified layer becomes difficult. With a wavelength exceeding 3000 nanometers, the possibility of the laser penetrating through silicon is increased and a modified layer becomes difficult to form. The laser can be, for example, stealth laser. When such laser is irradiated to a silicon substrate, the silicon single crystals are heated at the focus position of the laser to be modified to amorphous silicon or polysilicon.

The laser is irradiated at intervals of a certain pitch P1. In this manner, modified portions 122 in the modified layer 121 are formed at intervals of the pitch P1. When the pitch P1 is narrow, the modified portions 122 are connected together to be the modified layer 121 in the form of a layer (a band).

Figure 5A:
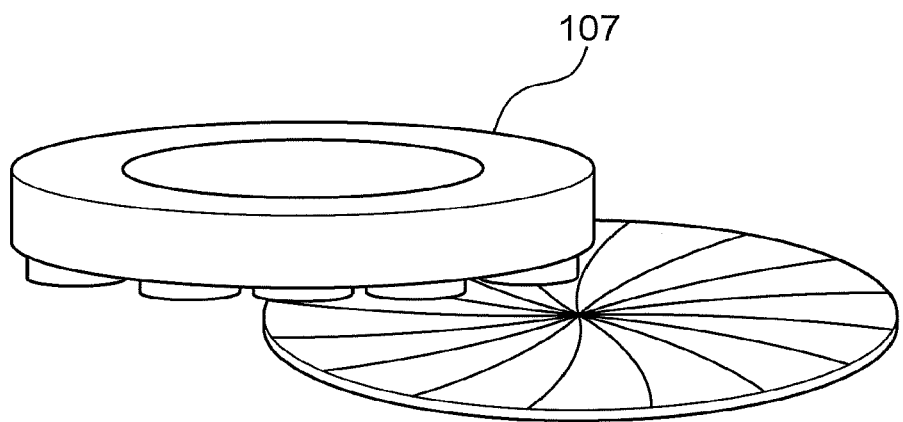
Figure 5B:
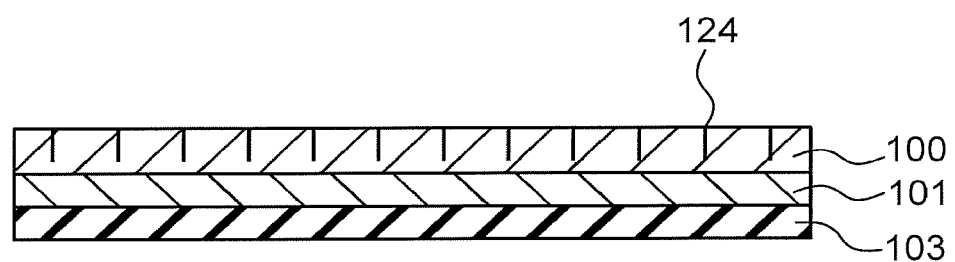

Next, as illustrated in FIG. 5A, the silicon substrate is polished with a grinding wheel 107 from the back surface of the first semiconductor wafer 100. At this time, the first semiconductor wafer 100 is ground to a position deeper than the modified layer 121 in FIG. 4 to remove the modified layer 121. Due to this process, the first semiconductor wafer 100 is thinned as illustrated in FIG. 5B. At this time, cleavages 124 from the modified layer 121 remain on the dicing lines due to stimuli at the time of grounding.

Figure 6A:
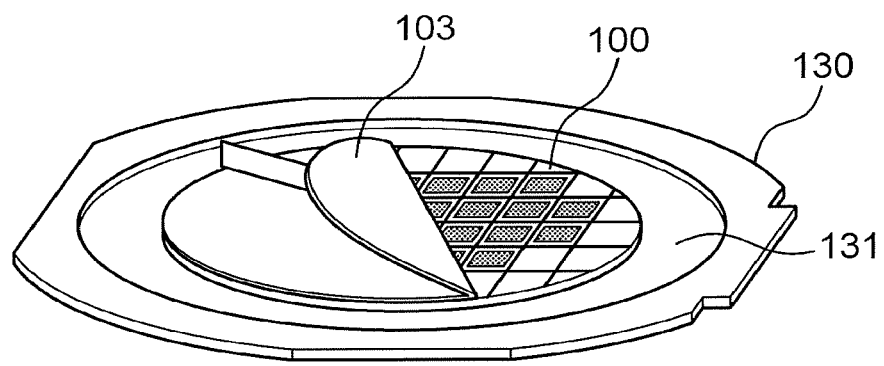

Subsequently, as illustrated in FIG. 6A, the back surface of the first semiconductor wafer 100 is stuck to a flexible resin tape 131 spread inside a wafer ring 130. Next, the protection tape 103 on the first semiconductor wafer 100 is removed.

Figure 6B:
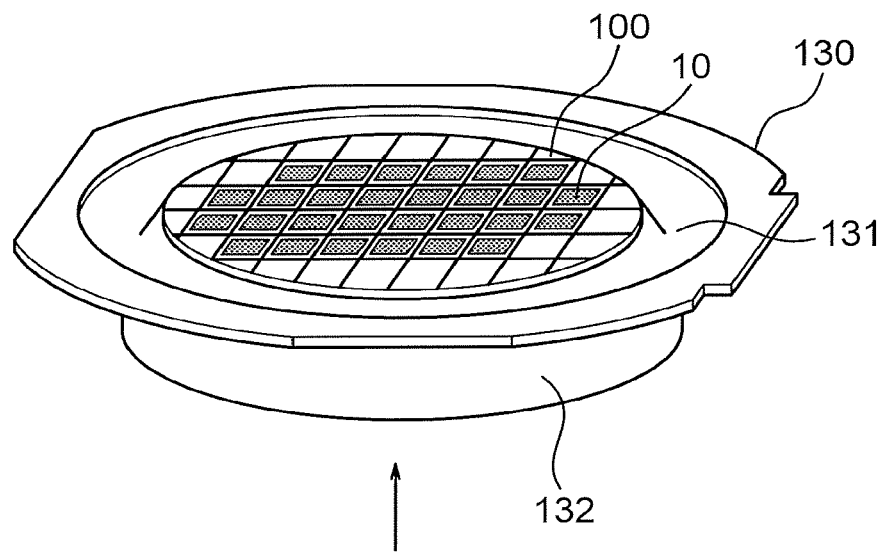

Subsequently, as illustrated in FIG. 6B, the resin tape 131 is pushed up from below with a pushing member 132 to pull (expand) the resin tape 131. Due to this process, the first semiconductor wafer 100 is pulled together with the resin tape 131. At this time, the first semiconductor wafer 100 is cleaved along the cleavages 124 to be singulated into the first semiconductor chips 10. The first semiconductor chips 10 are completed in this manner. As described above, the first semiconductor chips 10 are formed by singulation through cleavage after the modified layer 121 is removed. Therefore, the first side face FS1 thereof has no modified plane or crushed plane and becomes a cleavage plane.

Manufacturing Method of Second Semiconductor Chips 20a to 20c

A manufacturing method of the second semiconductor chips 20a to 20c is explained next. The manufacturing method of the second semiconductor chip 20b or 20c is identical to that of the second semiconductor chip 20a or can be readily inferred therefrom. Therefore, the manufacturing method of the second semiconductor chip 20a is explained and explanations of the manufacturing method of the second semiconductor chip 20b or 20c are omitted.

First, semiconductor elements (not illustrated) are formed on the third face F3 of a second semiconductor wafer 200. The semiconductor elements are formed for each semiconductor chip 20a. An interlayer dielectric film and a wiring layer (201 in FIGS. 7A and 7B) are formed on the semiconductor elements. Glass, silicon, a resin, ceramic, a metal, or the like is used as a support substrate 210.

Next, the second semiconductor wafer 200 is bonded onto the support substrate 210 with an adhesive 220. At this time, the second semiconductor wafer 200 is bonded with the third face F3 facing toward the support substrate 210. Subsequently, the silicon substrate is polished from the back surface of the second semiconductor wafer 200 with a grinding wheel. Due to this process, the second semiconductor wafer 200 is thinned to be equal to or less than 50 micrometers, for example.

Figure 7A:
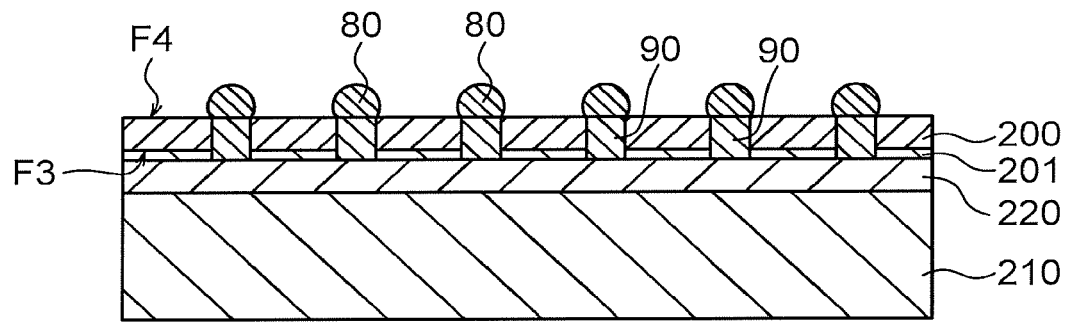
Figure 7B:
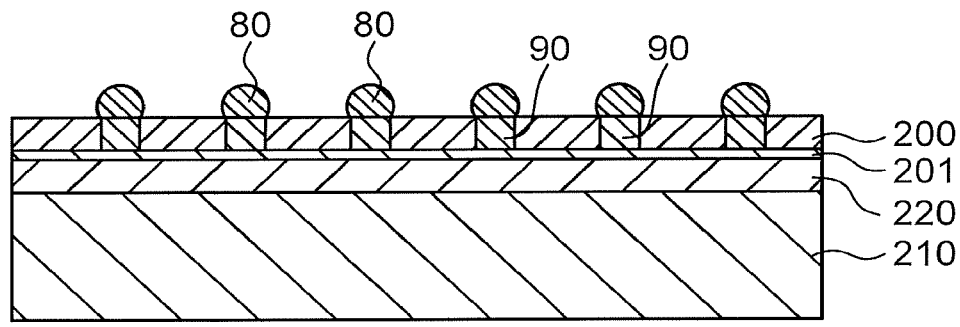

Next, as illustrated in FIG. 7A or 7B, the TSVs 90 are formed on the second semiconductor wafer 200. In FIG. 7A, the TSVs 90 pass through all of the second semiconductor wafer 200, the interlayer dielectric film, and the wiring layer 201. In FIG. 7B, the TSVs 90 pass through the second semiconductor wafer 200 and pass through parts of the interlayer dielectric film and the wiring layer 201 to be connected to the wiring layer 201. In the present embodiment, the TSVs 90 illustrated in either FIG. 7A or FIG. 7B can be used. The TSVs 90 can be formed by a front-side via method in which TSVs are formed from the third face F3 including the semiconductor elements, or can be formed by a back-side via method in which TSVs are formed from the fourth face F4 including no semiconductor elements. In the front-side via method, vias can be formed at middle points between a FEOL (Front End of Line) where transistors are formed and a BEOL (Back End of Line) where circuit wires are formed by a method called "via middle method".

Next, the metal bumps 80 are formed at one end portions of the TSVs 90 on the side of the fourth face F4, respectively.

Figure 8A:
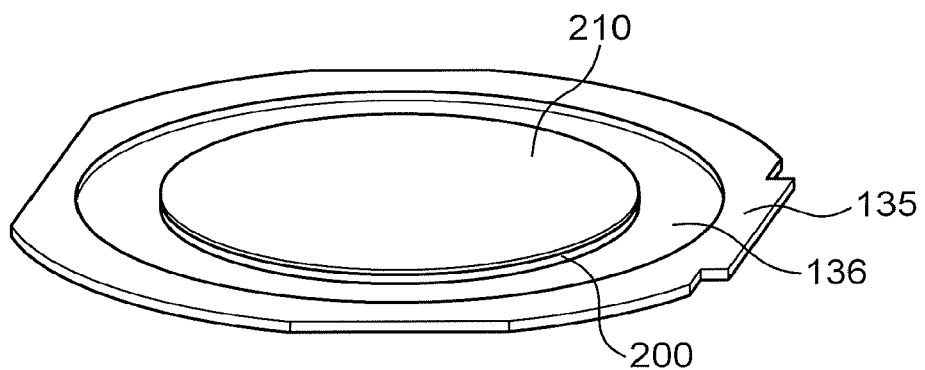

Subsequently, as illustrated in FIG. 8A, the fourth face F4 of the second semiconductor wafer 200 is stuck to a flexible resin tape 136 spread inside a wafer ring 135. Accordingly, the second semiconductor wafer 200 is positioned between the support substrate 210 and the resin tape 136 and the support substrate 210 is located on the second semiconductor wafer 200.

Figure 8B:
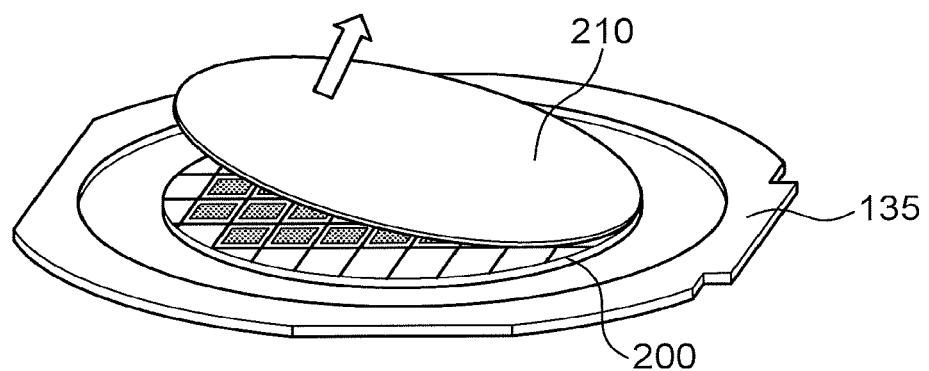

Next, as illustrated in FIG. 8B, the support substrate 210 is peeled off from the second semiconductor wafer 200. The method of peeling off the support substrate 210 is not particularly limited and the support substrate 210 can be mechanically peeled from the second semiconductor wafer 200. The support substrate 210 can be peeled from the second semiconductor wafer 200 after applying light, laser, a UV lamp, plasma, or the like to the adhesive 220 to weaken the adhesive force of the adhesive 220. The adhesive 220 can be dissolved with a chemical. Alternatively, the support substrate 210 can be removed by being ground. After peeling of the support substrate 210, the second semiconductor wafer 200 is cleaned as necessary.

Figure 9:
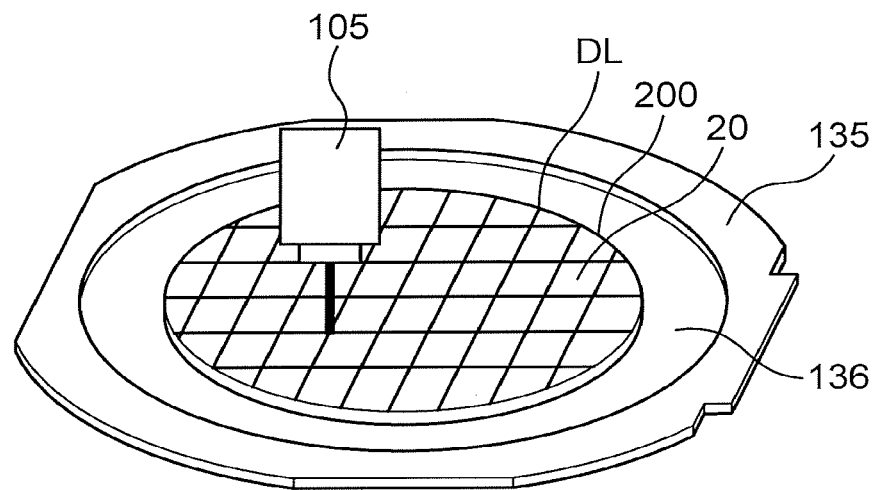
Figure 10:
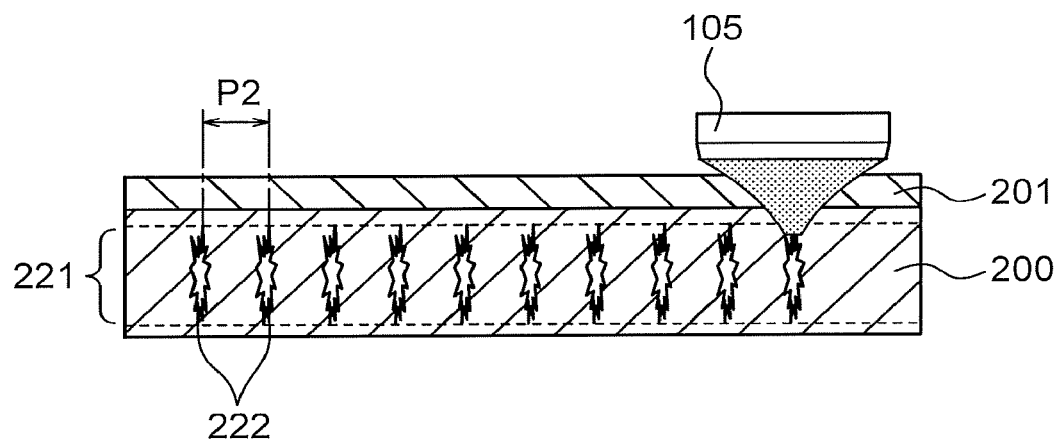

Next, as illustrated in FIG. 9, laser is irradiated to dicing lines from the front surface (the third face F3) of the second semiconductor wafer 200 using the laser oscillator 105. Due to this process, a modified layer (amorphous layer or polysilicon layer) 221 is formed in an inner part of the second semiconductor wafer 200 (an inner part of the silicon substrate) as illustrated in FIG. 10. FIG. 10 is a sectional view of a portion along the dicing line DL in FIG. 9. The laser oscillator 105 brings the laser into focus at an arbitrary depth position in the silicon substrate. Such irradiation of the laser to the silicon substrate heats silicon single crystals at the focus position of the laser to be modified to amorphous silicon or polysilicon.

The laser is irradiated at intervals of a certain pitch P2. Accordingly, modified portions 222 are formed at intervals of the pitch P2 in the modified layer 221. When the pitch P2 is narrow, the modified portions 222 are connected together to be the modified layer 221 in the form of a layer (a band).

Figure 11:
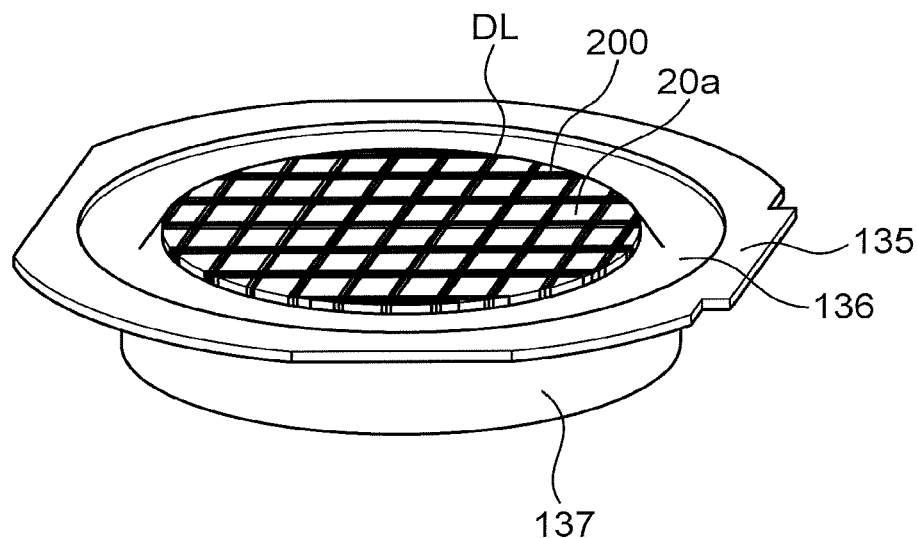

Next, as illustrated in FIG. 11, the resin tape 136 is pushed up from below with a pushing member 137 to pull (expand) the resin tape 136. Due to this process, the second semiconductor wafer 200 is pulled together with the resin tape 136. At this time, the second semiconductor wafer 200 is cleaved along the modified layer 221 of the dicing lines DL to be singulated into the second semiconductor chips 20a. The second semiconductor chips 20a are completed in this manner. As described above, the second semiconductor chips 20a are obtained by forming the modified layer 221 after thinning the wafer, and cleaving the wafer along the modified layer 221. Therefore, the second side face FS2 of each of the second semiconductor chips 20a has both a modified plane and a cleavage plane. The modified plane is a plane of the second side face FS2 appearing when the wafer is cut along the modified layer 221.

The second semiconductor chips 20b and 20c are also formed in the same manner as the second semiconductor chip 20a. There is a case where the second semiconductor chip 20c that is the closest to the wiring substrate 40 among the semiconductor chips 10 and 20a to 20c has electrode pads to be connected to the metal bumps 60 in FIG. 1 or a redistribution layer. In this case, the semiconductor chip 20c is formed by singulation through laser dicing in the manner described above after the electrode pads or the redistribution layer (not illustrated) is formed on a semiconductor wafer.

Stacking Method

A method of staking the first semiconductor chip 10 and the second semiconductor chips 20a to 20c on the wiring substrate 40 is explained next.

Figure 12A:
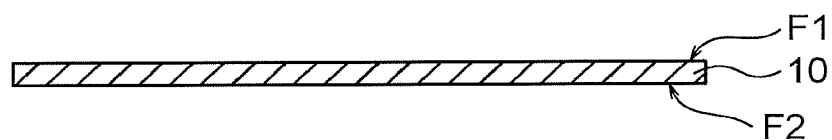

First, the first semiconductor chip 10 is prepared as illustrated in FIG. 12A.

Next, the second semiconductor chip 20a is stacked on the first face F1 of the first semiconductor chip 10. At this time, the second semiconductor chip 20a is stacked with the fourth face F4 that includes the metal bumps 80 facing the first face F1 of the first semiconductor chip 10.

Subsequently, the second semiconductor chip 20b is stacked on the third face F3 of the second semiconductor chip 20a. At this time, the second semiconductor chip 20b is stacked with the fourth face F4 that includes the metal bumps 80 facing the third face F3 of the second semiconductor chip 20a.

Figure 12B:
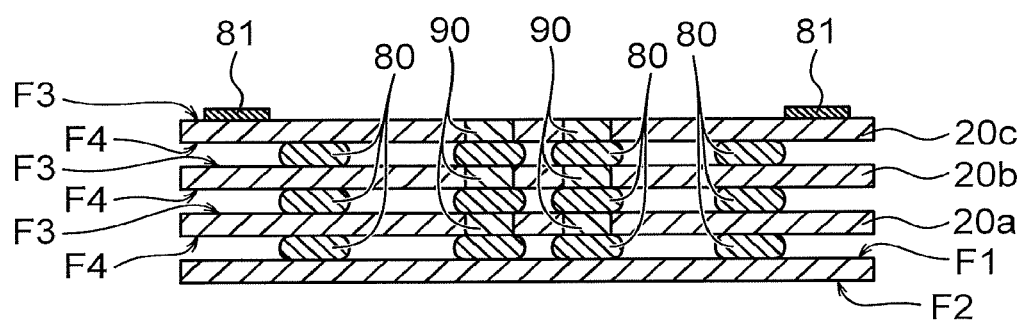

Subsequently, the second semiconductor chip 20c is stacked on the third face F3 of the second semiconductor chip 20b. At this time, the second semiconductor chip 20c is stacked with the fourth face F4 that includes the metal bumps 80 facing the third face F3 of the second semiconductor chip 20b. A stacked body including the first semiconductor chip 10 and the second semiconductor chips 20a to 20c is thus formed as illustrated in FIG. 12B. At the time of stacking, a flip chip bonder or the like is used to pressurize and heat the stacked body to a temperature equal to or higher than the melting point of the metal bumps 80 to melt the metal bumps 80 and connect vertically adjacent ones of the first and second semiconductor chips 10 and 20a to 20c. Alternatively, the stacked body is pressurized and provisionally pressure-bonded at a temperature equal to or lower than the melting point of the metal bumps 80 with a flip chip bonder or the like, and is thereafter heated to a temperature equal to or higher than the melting point of the metal bumps 80 to melt the metal bumps 80 using a reducing-atmosphere reflow furnace or the like, to connect vertically adjacent ones of the first and second semiconductor chips 10 and 20a to 20c. The stacked body can simply be pressurized and provisionally pressure-bonded at a temperature equal to or lower than the melting point of the metal bumps 80 with a flip chip bonder or the like. An atmosphere of hydrogen, argon plasma, a formic acid, or the like is used for the reducing atmosphere reflow. Nitrogen or the like can be added to the atmosphere of hydrogen, argon plasma, a formic acid, or the like as necessary.

The metal bumps 80 between chips can be formed on an upper semiconductor chip and connected to the electrode pads (not illustrated) of a lower semiconductor chip. The metal bumps 80 can be formed on a lower semiconductor chip and connected to the electrode pads (not illustrated) of an upper semiconductor chip. Alternatively, the metal bumps 80 can be formed on both an upper semiconductor chip and a lower semiconductor chip to connect the metal bumps to each other. The TSVs 90 are electrically connected to the TSVs 90 or semiconductor elements of other semiconductor chips via the metal bumps 80. The number of the second semiconductor chips is not particularly limited and four or more second semiconductor chips can be stacked.

Figure 13A:
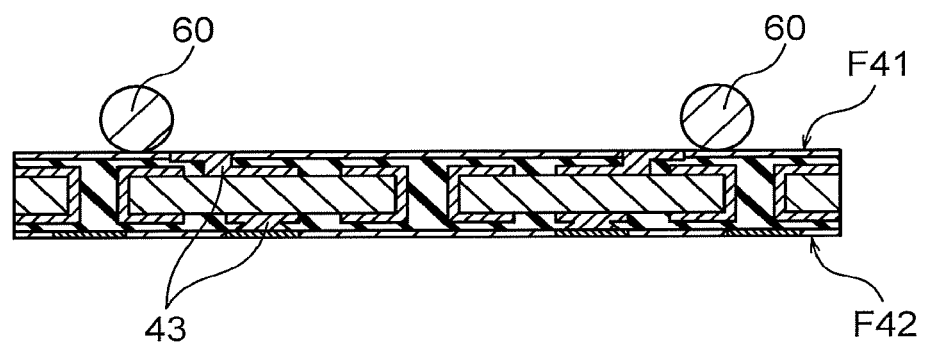

Next, as illustrated in FIG. 13A, the wiring substrate 40 is prepared separately from the stacked body. The wiring substrate 40 has the metal bumps 60 provided on the front face F41 and connected to the redistribution layer.

Figure 13B:
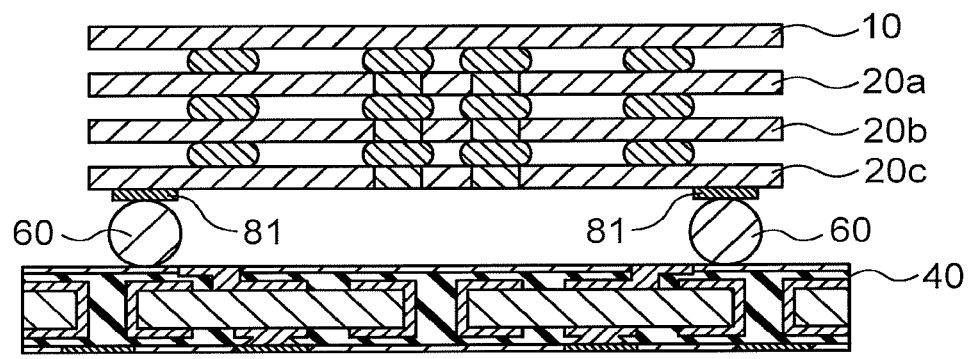

Subsequently, as illustrated in FIG. 13B, the stacked body illustrated in FIG. 12B is mounted (flip chip mounted) on the wiring substrate 40. At this time, the stacked body is mounted with the third face F3 of the second semiconductor chip 20c facing the front face F41 of the wiring substrate 40. In this manner, the metal bumps 60 are electrically connected to pads 81 of the second semiconductor chip 20c, respectively, as illustrated in FIG. 13B. At this time, a flip chip bonder or the like is used to pressurize and heat the stacked body and the wiring substrate 40 to a temperature equal to or higher than the melting point of the metal bumps 60 to melt the metal bumps 60 and connect the metal bumps 60 to the pads 81, respectively. Alternatively, the stacked body is pressurized and provisionally pressure-bonded at a temperature equal to or lower than the melting point of the metal bumps 60 with a flip chip bonder or the like, and is thereafter heated to a temperature equal to or higher than the melting point of the metal bumps 60 to melt the metal bumps 60 using a reducing-atmosphere reflow furnace or the like, to connect the metal bumps 60 to the pads 81, respectively. An atmosphere of hydrogen, argon plasma, a formic acid, or the like is used for the reducing-atmosphere reflow. Nitrogen or the like can be added to the atmosphere of hydrogen, argon plasma, a formic acid, or the like as necessary. For example, a metal such as Al, Cu, Au, Ni, Pd, Ti, TiN, Ta, TaN, W, or WN, or a composite membrane or alloy including two or more of these metals is used for the pads 81. A metal such as Sn, Ag, Cu, Au, Bi, Zn, In, Ni, or Ge, or a composite membrane or alloy including two or more of these metals can, for example, be used for the metal bumps 80.

While the metal bumps 60 are provided on the wiring substrate 40 in the present embodiment, the metal bumps 60 can be provided on the pads 81 of the second semiconductor chip 20c. Alternatively, the metal bumps 60 can be provided on both the wiring substrate 40 and the second semiconductor chip 20c.

The metal bumps 80 are provided on the fourth faces F4 of the second semiconductor chips 20a to 20c in the present embodiment. However, the metal bumps 80 can alternatively be provided on the first face F1 of the first semiconductor chip 10 and the third faces F3 of the second semiconductor chips 20a and 20b. In this case, the metal bumps 80 do not always need to be provided on the second semiconductor chip 20c.

Next, the first and second semiconductor chips 10 and 20a to 20c are sealed with the resin 50. The resin 50 can be a mold resin or an underfill material.

The metal balls 70 are thereafter provided on the back surface F42 of the wiring substrate 40, whereby the semiconductor device 1 illustrated in FIG. 1 is completed.

According to the present embodiment, the entire first side face FS1 of the first semiconductor chip 10 is formed as a cleavage plane and a modified plane is provided on each of the second side faces FS2 of the second semiconductor chips 20a to 20c. Because the first side face FS1 of the first semiconductor chip 10 close to the end E50 of the resin 50 (the end of the package) is the cleavage plane, cracks on the resin 50 and the semiconductor chips 10 and 20a to 20c can be suppressed. Besides, provision of the modified plane on each of the second side faces FS2 of the second semiconductor chips 20a to 20c can enhance the adhesiveness between the resin 50 and the second semiconductor chips 20a to 20c.

Further, according to the present embodiment, the semiconductor chips 10 and 20a to 20c are formed by singulation through laser dicing without using blade dicing. Therefore, defects such as breaking and chipping of the semiconductor chips 10 and 20a to 20c, and a poor appearance due to adhesion of foreign matters to the chips can be suppressed.

Second Embodiment

Figure 14:
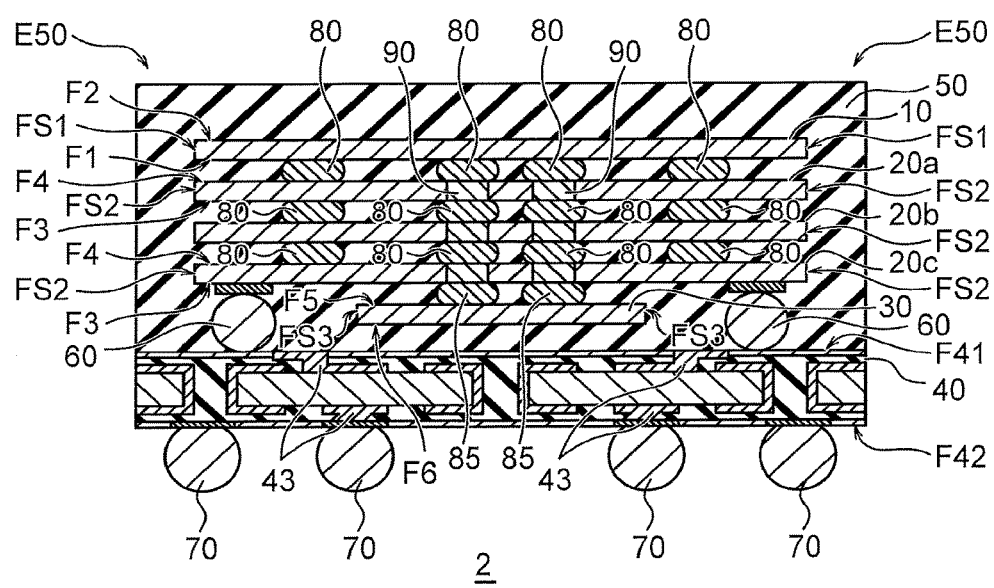
FIG. 14 is a sectional view illustrating a configuration example of a semiconductor device according to a second embodiment.

FIG. 14 is a sectional view illustrating a configuration example of a semiconductor device according to a second embodiment. A semiconductor device 2 according to the second embodiment further includes a third semiconductor chip 30 and metal bumps 85. The third semiconductor chip 30 is, for example, a NAND controller that controls the first and second semiconductor chips 10 and 20a to 20c. Other constituent elements of the semiconductor device 2 according to the second embodiment can be identical to corresponding ones of the semiconductor device 1 according to the first embodiment.

The third semiconductor chip 30 has a fifth face F5, a sixth face F6, and a third side face FS3. The third semiconductor chip 30 is provided between the wiring substrate 40 and the second semiconductor chip 20c. For example, a silicon substrate thinned to be equal to or less than about 50 micrometers is used as the third semiconductor chip 30. Semiconductor elements (not illustrated) are formed on the fifth face F5 of the third semiconductor chip 30. The sixth face F6 is provided on the opposite side of the third semiconductor chip 30 to the fifth face F5. The third side face FS3 is a side face connecting the outer edge of the fifth face F5 and the outer edge of the sixth face F6.

The areas of the fifth face F5 and the sixth face F6 of the third semiconductor chip 30 are smaller than the areas of the first face F1 and the second face F2 of the first semiconductor chip 10 and are smaller than the areas of the third face F3 and the fourth face F4 of each of the second semiconductor chips 20a to 20c. Therefore, the third side face FS3 is located nearer the center of the semiconductor device 2 than the first and second side faces FS1 and FS2. Accordingly, the third side face FS3 is farther from the end E50 of the resin 50 than the first side face FS1 and does not cause cracks of the resin 50. Besides, the third side face FS3 is located nearer the center of the semiconductor device 2 than the second side face FS2 and thus the adhesiveness to the resin 50 does not matter much. Therefore, the third side face FS3 can be any of a cleavage plane, a modified plane, and a crushed plane. That is, the third side face FS3 can be any of a crushed plane caused by blade dicing, a modified plane and a cleavage plane caused by laser dicing, and a cleavage plane containing no modified plane.

The metal bumps 85 are provided between the second semiconductor chip 20c and the third semiconductor chip 30 and electrically connect the TSVs 90 of the second semiconductor chip 20c to the semiconductor elements or the like provided on the third semiconductor chip 30. This enables the third semiconductor chip 30 to control the first and second semiconductor chips 10 and 20a to 20c as a NAND controller, for example.

The third semiconductor chip 30 can be formed by singulation of the third semiconductor wafer through laser dicing similarly in the manufacturing method of the first semiconductor chip 10 or the second semiconductor chips 20a to 20c. Accordingly, the third side face FS3 of the third semiconductor chip 30 becomes a cleavage plane or becomes a plane containing a modified plane and a cleavage plane.

Alternatively, the third semiconductor chip 30 can be formed by singulation of the third semiconductor wafer through blade dicing. A method of forming the third semiconductor chip 30 by blade dicing is explained below.

FIGS. 15A to 19 illustrate a manufacturing method of the third semiconductor chip 30.

First, semiconductor elements (not illustrated) are formed on the fifth face F5 of a third semiconductor wafer 300. An interlayer dielectric film and a wiring layer are formed on the semiconductor elements.

Figure 15A:
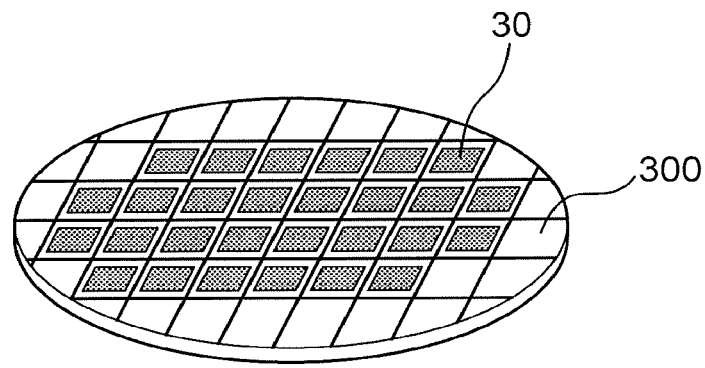
FIGS. 15A to 19 illustrate a manufacturing method of the third semiconductor chip.
Figure 15B:
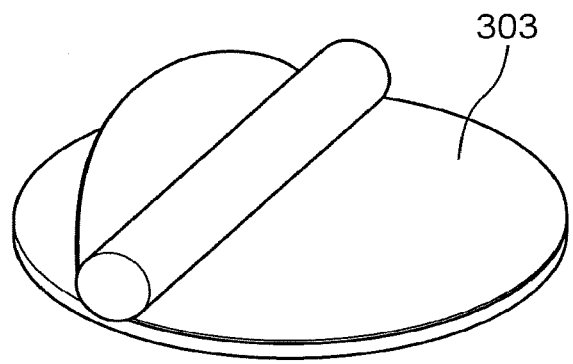

Next, a protection tape 303 is stuck to the front surface (the fifth face F5) of the third semiconductor wafer 300 as illustrated in FIG. 15B.

Figure 16:
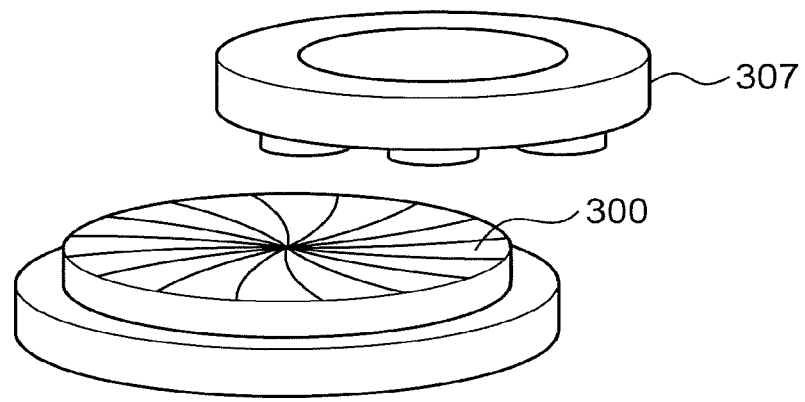

Subsequently, the silicon substrate is polished with a grinding wheel 307 from the back surface (the sixth face F6) of the third semiconductor wafer 300 as illustrated in FIG. 16. The third semiconductor wafer 300 is thus thinned to be equal to or less than 50 micrometers, for example.

Figure 17A:
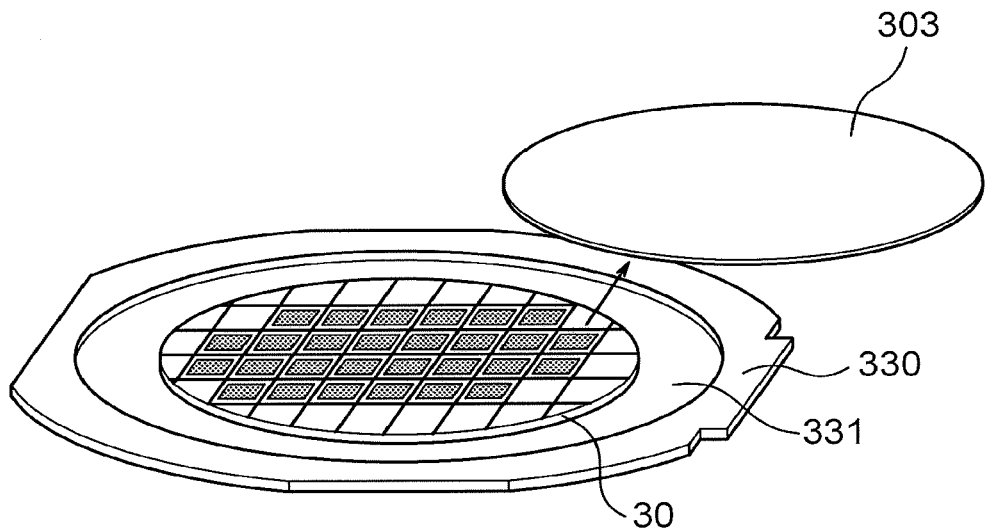

Subsequently, as illustrated in FIG. 17A, the back surface of the third semiconductor wafer 300 is stuck to a flexible resin tape 331 that is spread inside a wafer ring 330. Next, the protection tape 303 on the third semiconductor wafer 300 is removed.

Figure 17B:
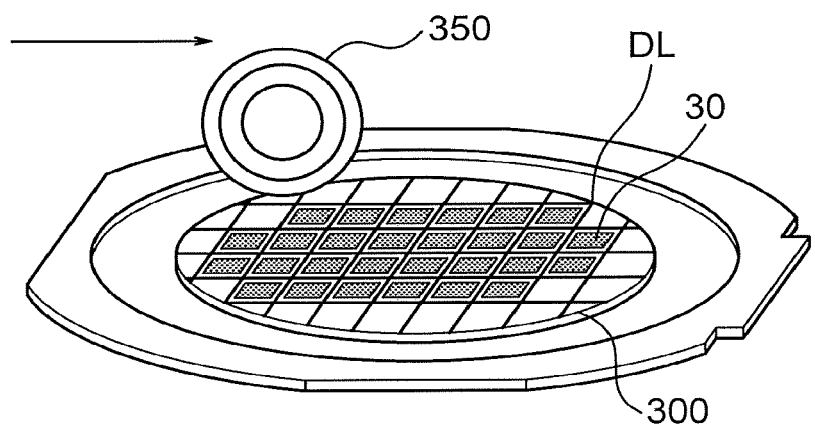

Next, as illustrated in FIG. 17B, the third semiconductor wafer 300 is cut at dicing lines DL with a blade 350 to singulate the third semiconductor wafer 300 into the third semiconductor chips 30. The third semiconductor chips 30 are thereby completed. When blade dicing is thus used, the third side face FS3 of each of the third semiconductor chips 30 becomes a crushed plane including irregularities. The wafer can be singulated into chips using a pre-dicing method where wafer grinding is performed after dicing.

A method of stacking the first to third semiconductor chips 10, 20a to 20c, and 30 on the wiring substrate 40 is explained next.

First, the first and second semiconductor chips 10 and 20a to 20c are stacked in the manner as described with reference to FIGS. 12A and 12B.

Figure 18:
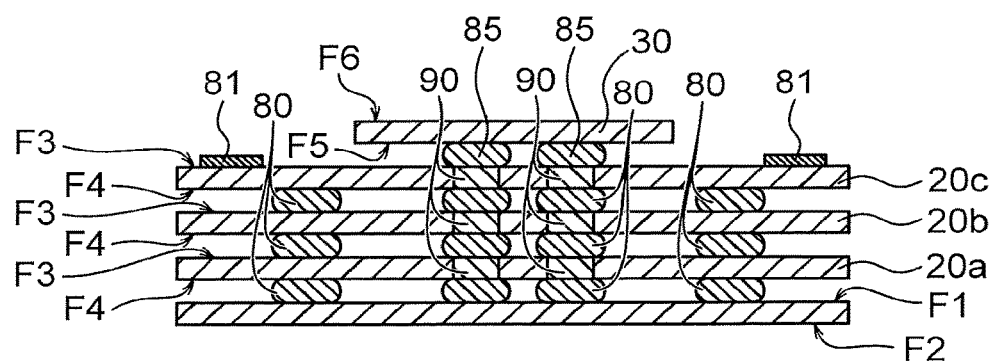

Next, as illustrated in FIG. 18, the third semiconductor chip 30 is stacked on the third face F3 of the second semiconductor chip 20c. At this time, the third semiconductor chip 30 is stacked with the fifth face F5 that includes the metal bumps 85 facing the third face F3 of the second semiconductor chip 20c. A stacked body including the first to third semiconductor chips 10, 20a to 20c, and 30 is thus formed as illustrated in FIG. 18. At this time, a flip chip bonder or the like is used to pressurize and heat the stacked body including the first to third semiconductor chips 10, 20a to 20c, and 30 to a temperature equal to or higher than the melting points of the metal bumps 80 and 85 to melt the metal bumps 80 and 85, thereby to connect vertically adjacent ones of the first to third semiconductor chips 10, 20a to 20c, and 30. Alternatively, the stacked body including the first to third semiconductor chips 10, 20a to 20c, and 30 is pressurized and provisionally pressure-bonded at a temperature equal to or lower than the melting points of the metal bumps 80 and 85 using a flip chip bonder or the like, and is thereafter heated to a temperature equal to or higher than the melting points of the metal bumps 80 and 85 using a reducing-atmosphere reflow furnace or the like to melt the metal bumps 80 and 85, thereby connecting vertically adjacent ones of the first to third semiconductor chips 10, 20a to 20c, and 30. The stacked body can be simply pressurized and provisionally pressure-bonded at a temperature equal to or lower than the melting points of the metal bumps 80 and 85 using a flip chip bonder or the like. An atmosphere of hydrogen, argon plasma, a formic acid, or the like is used as the reducing atmosphere reflow. Nitrogen can be added to the atmosphere of hydrogen, argon plasma, a formic acid, or the like as necessary. One ends of the TSVs 90 of the semiconductor chip 20c are electrically connected to the wires, the semiconductor elements, and the like of the third semiconductor chip 30 via the metal bumps 85. The number of the second semiconductor chips is not particularly limited. Two or less second semiconductor chips, or four or more second semiconductor chips can be stacked.

Next, the wiring substrate 40 is prepared separately from the stacked body, as explained with reference to FIG. 13A. The wiring substrate 40 has the metal bumps 60 provided on the front surface F41.

Figure 19:
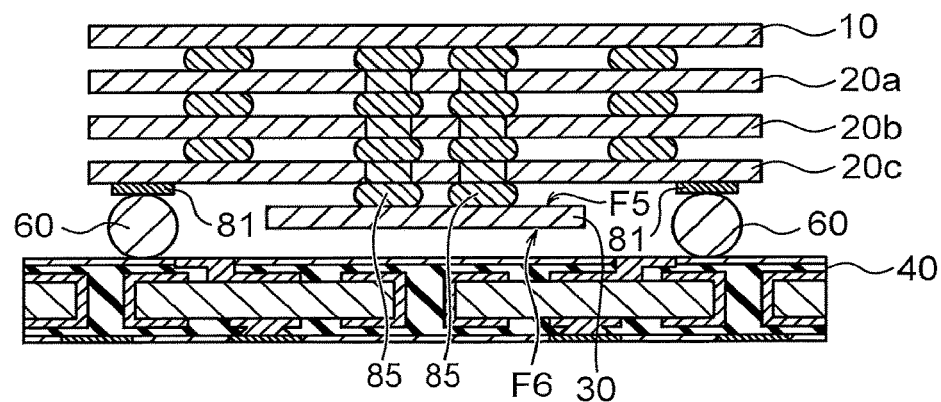

Subsequently, as illustrated in FIG. 19, the stacked body illustrated in FIG. 18 is mounted (flip chip mounted) on the wiring substrate 40. At this time, the stacked body is mounted with the sixth face F6 of the third semiconductor chip 30 facing the front surface F41 of the wiring substrate 40. This electrically connects the metal bumps 60 to the pads 81 of the second semiconductor chip 20c, respectively, as illustrated in FIG. 19. At this time, a flip chip bonder or the like is used to pressurize and heat the stacked body and the wiring substrate 40 to a temperature equal to or higher than the melting point of the metal bumps 60 to melt the metal bumps 60 and connect the metal bumps 60 to the pads 81, respectively. Alternatively, the stacked body is pressurized and provisionally pressure-bonded at a temperature equal to or lower than the melting point of the metal bumps 60 with a flip chip bonder or the like, and is thereafter heated to a temperature equal to or higher than the melting point of the metal bumps 60 using a reducing-atmosphere reflow furnace or the like to melt the metal bumps 60 and connect the metal bumps 60 to the pads 81, respectively. An atmosphere of hydrogen, argon plasma, a formic acid, or the like is used as the reducing atmosphere reflow. Nitrogen or the like can be added to the atmosphere of hydrogen, argon plasma, a formic acid, or the like as necessary.

Next, the first to third semiconductor chips 10, 20a to 20c, and 30 are sealed with the resin 50. The resin 50 can be a mold resin or an underfill material.

Thereafter, the metal balls 70 are provided on the back surface F42 of the wiring substrate 40, whereby the semiconductor device 2 illustrated in FIG. 14 is completed.

While the third semiconductor chip 30 is provided between the wiring substrate 40 and the second semiconductor chip 20c according to the second embodiment, other constituent elements of the second embodiment can be identical to corresponding ones of the first embodiment. That is, the entire first side face FS1 of the first semiconductor chip 10 is a cleaved plane and a modified plane is provided on each of the second side faces FS2 of the second semiconductor chips 20a to 20c. Therefore, the second embodiment can achieve effects identical to those of the first embodiment.

Modification

FIGS. 20 to 30 are sectional views illustrating configuration examples of a semiconductor device according to modifications of the first or second embodiment.

Figure 20:
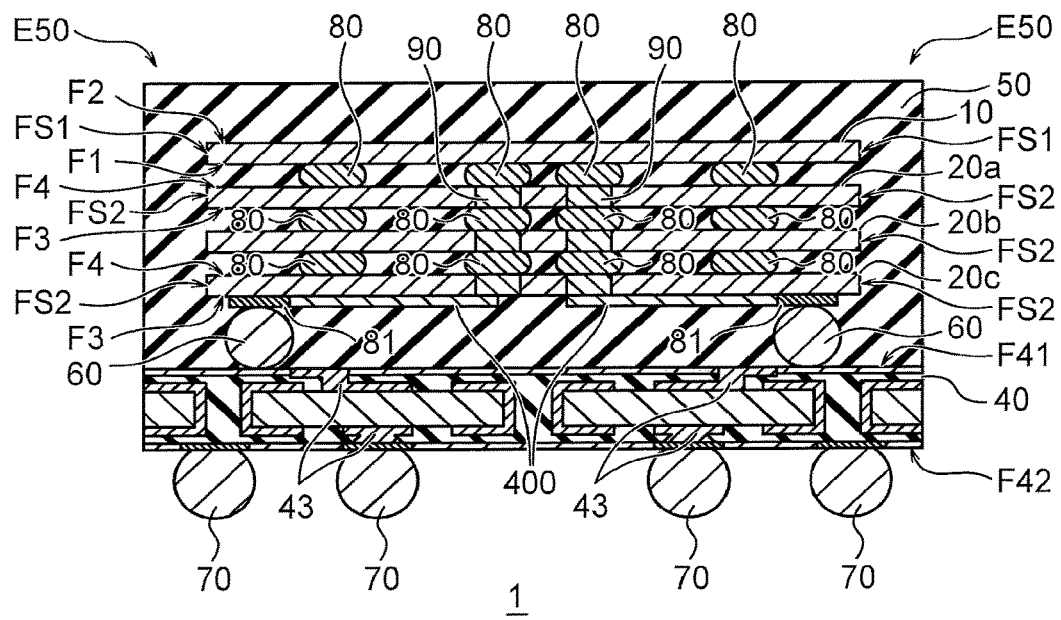
FIGS. 20 to 30 are sectional views illustrating configuration examples of a semiconductor device according to modifications of the first or second embodiment.

A semiconductor device illustrated in FIG. 20 includes redistribution layers 400 on the third face F3 of the second semiconductor chip 20c facing the wiring substrate 40. The redistribution layers 400 are electrically connected to the metal bumps 60 via the pads 81, respectively.

Figure 21:
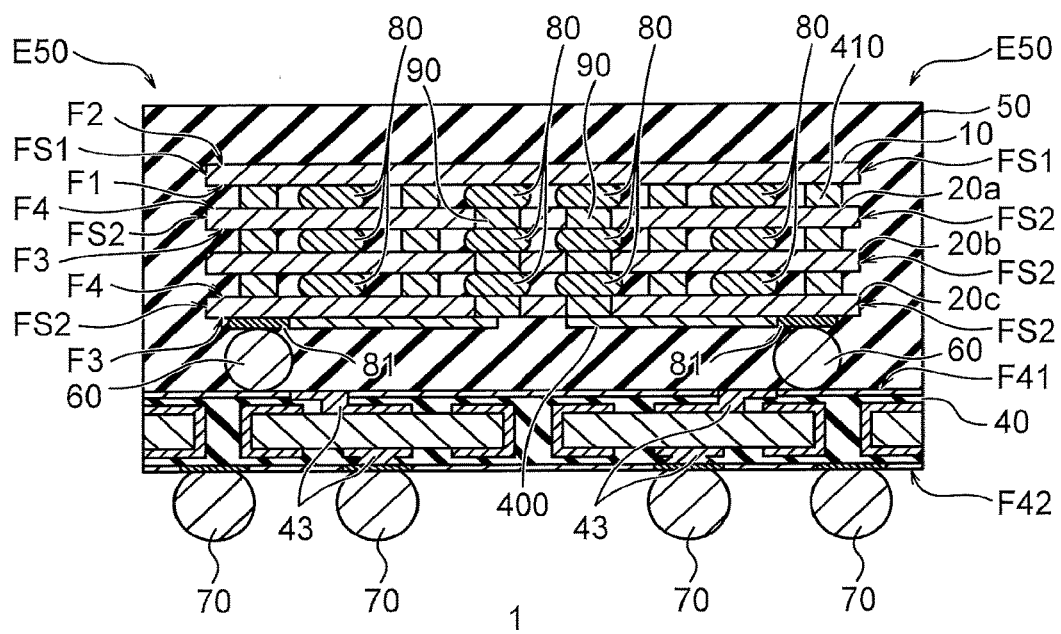

A semiconductor device illustrated in FIG. 21 includes an adhesive 410 between adjacent ones of the first and second semiconductor chips 10 and 20a to 20c. During stacking of the first and second semiconductor chips 10 and 20a to 20c, the adhesive 410 is used to bond adjacent ones of the first and second semiconductor chips 10 and 20a to 20c together. The adhesive 410 improves the adhesiveness between adjacent ones of the first and second semiconductor chips 10 and 20a to 20c. The adhesive 410 is, for example, a photosensitive adhesive and is processed into an arbitrary pattern on the fourth face F4 using a lithography technology.

Figure 22:
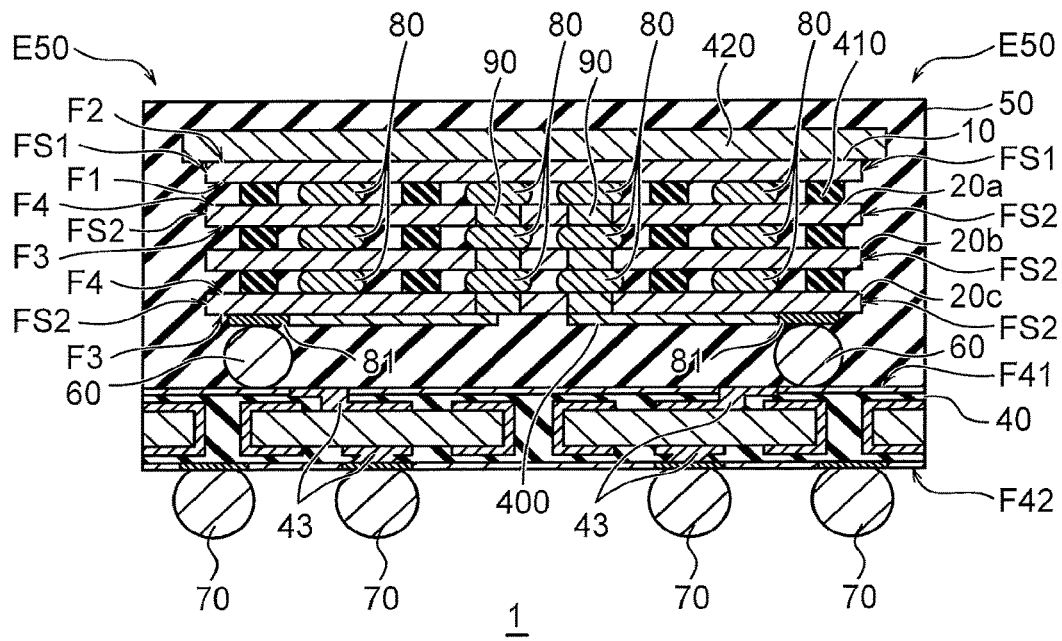

A semiconductor device illustrated in FIG. 22 includes a support body 420 on the second face F2 of the first semiconductor chip 10. For example, a metal, a resin, silicon, or glass is used as the support body 420. For example, Cu, Ni, Fe, or Co, or an alloy or composite body including these metals is used as the metal. The metal can be a 42 alloy. Provision of the support body 420 suppresses warp of the chips. The support body 420 and the first semiconductor chip 10 are bonded together with a resin film such as a die attach film, or an adhesive (not illustrated).

Figure 23:
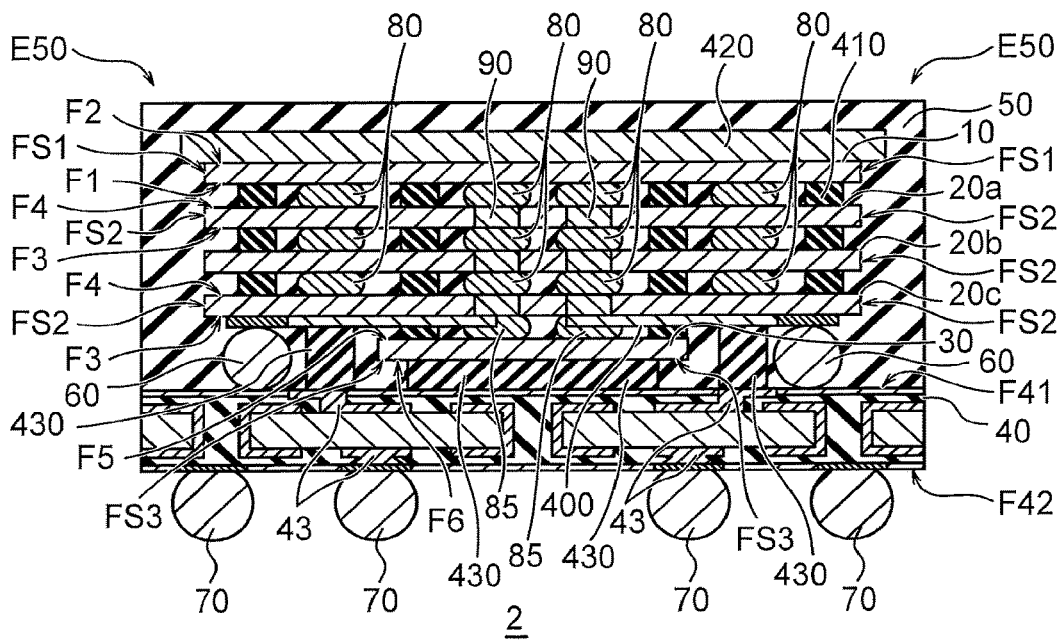

A semiconductor device illustrated in FIG. 23 includes an adhesive 430 between the second semiconductor chip 20c and the wiring substrate 40. The adhesive 430 improves the adhesiveness between the stacked body including the first and second semiconductor chips 10 and 20a to 20c and the wiring substrate 40 during mounting of the stacked body on the wiring substrate 40. When the third semiconductor chip 30 is used, the adhesiveness between the third semiconductor chip 30 and the wiring substrate 40 is improved by forming the adhesive 430 also between the third semiconductor chip 30 and the wiring substrate 40.

Figure 24:
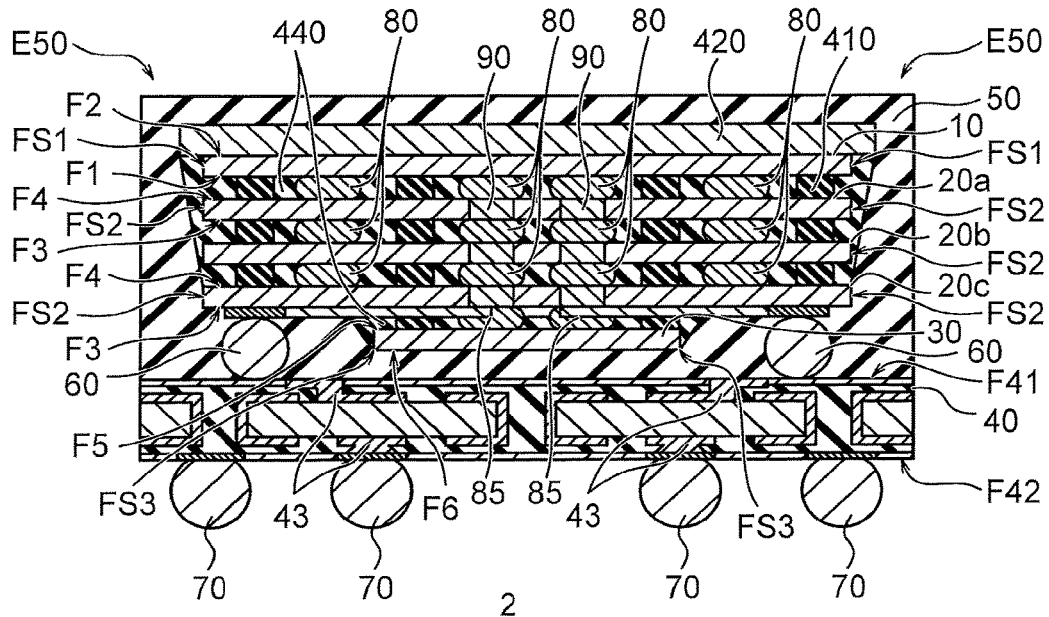

In a semiconductor device illustrated in FIG. 24, the stacked body including the first and second semiconductor chips 10 and 20a to 20c is sealed with a resin 440 before mounted on the wiring substrate 40. After the stacked body sealed with the resin 440 is mounted on the wiring substrate 40, the stacked body and the wiring substrate 40 are sealed together with the resin 50. During mounting of the stacked body including the first and second semiconductor chips 10 and 20a to 20c on the wiring substrate 40, the first and second semiconductor chips 10 and 20a to 20c are protected by the resin 440.

Figure 25:
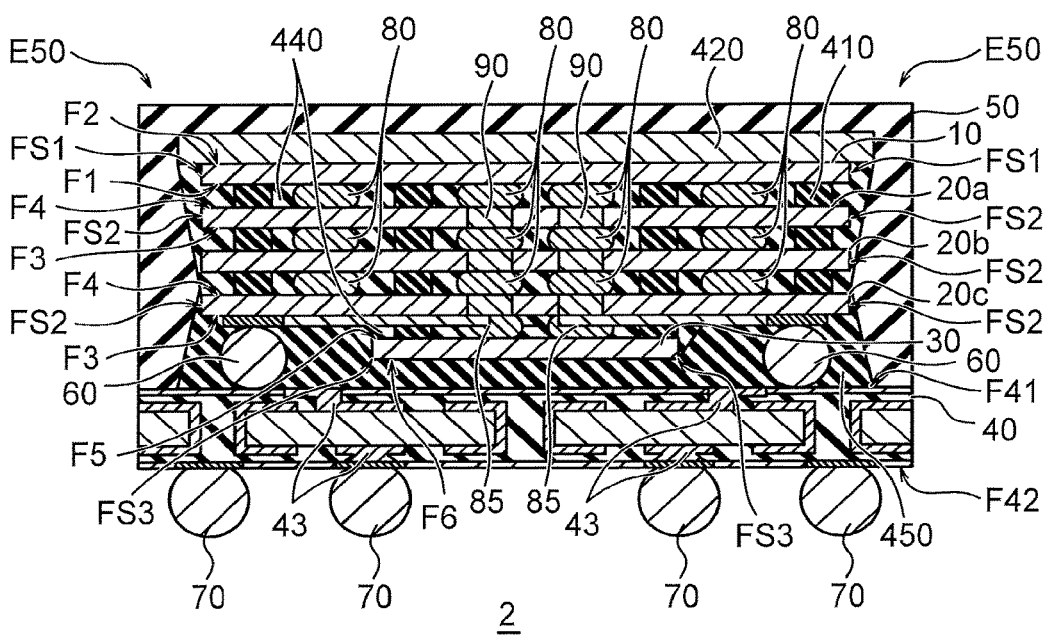

In a semiconductor device illustrated in FIG. 25, the stacked body including the first and second semiconductor chips 10 and 20a to 20c is sealed with the resin 440 before mounted on the wiring substrate 40. During mounting of the stacked body sealed with the resin 440 on the wiring substrate 40, a resin 450 is applied onto the wiring substrate 40. Accordingly, the stacked body and the wiring substrate 40 can be bonded together with the resin 450 and the adhesiveness between the stacked body and the wiring substrate 40 can be improved.

Figure 26:
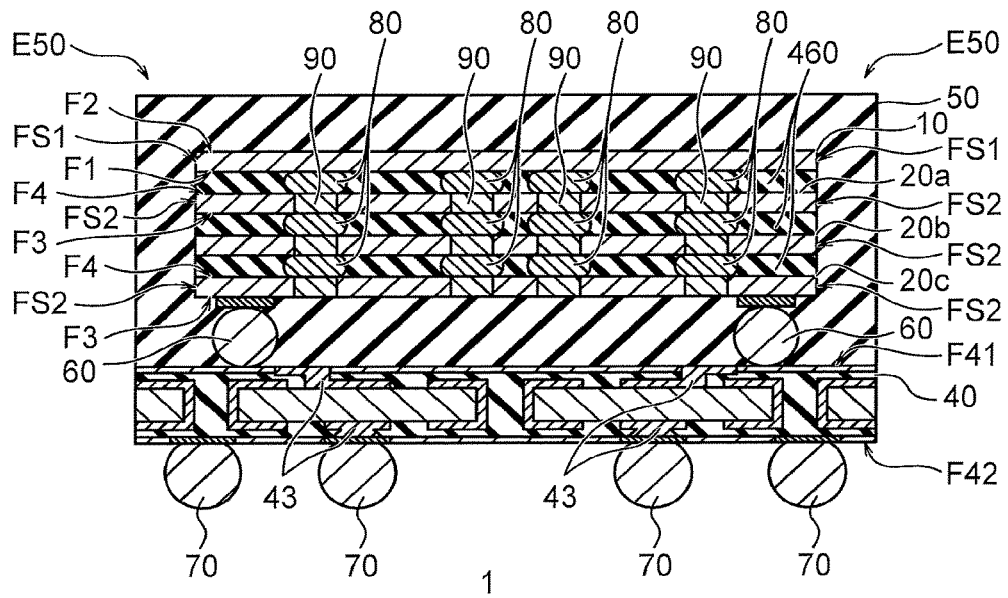

In a semiconductor device illustrated in FIG. 26, a resin film 460 is provided between adjacent ones of the first and second semiconductor chips 10 and 20a to 20c. Adjacent ones of the first and second semiconductor chips 10 and 20a to 20c can be bonded together with the resin film 460 as described above during stacking of the first and second semiconductor chips 10 and 20a to 20c. This improves the adhesiveness between adjacent ones of the first and second semiconductor chips 10 and 20a to 20c.

Figure 27:
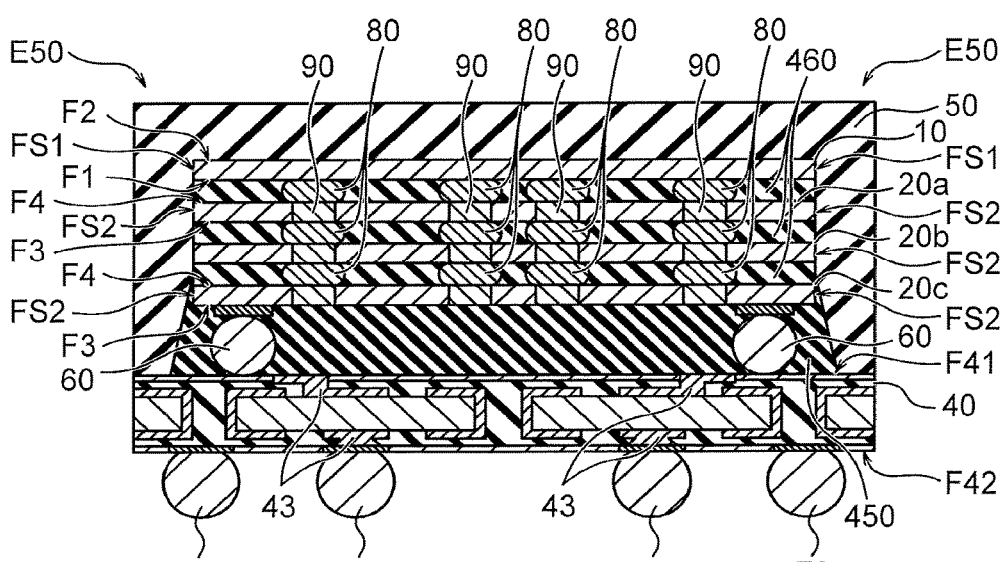

In a semiconductor device illustrated in FIG. 27, the resin 450 is applied onto the wiring substrate 40 during mounting of the stacked body illustrated in FIG. 26 on the wiring substrate 40. This can bond the stacked body and the wiring substrate 40 together with the resin 450 and can improve the adhesiveness between the stacked body and the wiring substrate 40.

Figure 28:
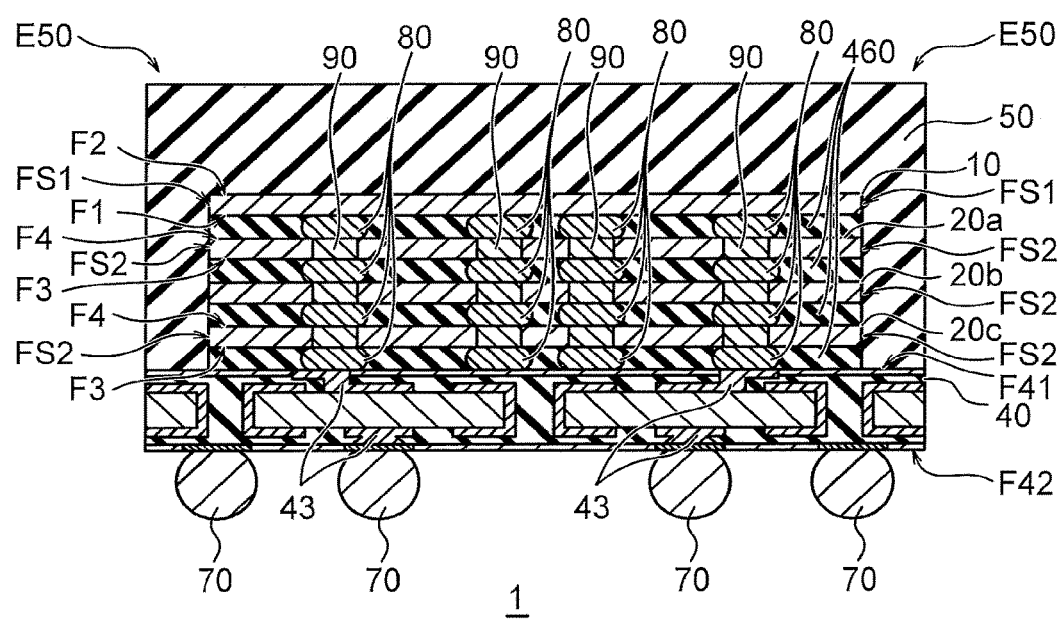

In a modification illustrated in FIG. 28, the second semiconductor chips 20c, 20b, and 20a and the first semiconductor chip 10 are stacked in this order directly on the wiring substrate 40. In this case, the metal bumps 60 are unnecessary. A semiconductor device can be manufactured also in this way. In this modification, adjacent ones of the first and second semiconductor chips 10 and 20a to 20c are bonded together with the resin film 460 during stacking of the first and second semiconductor chips 10 and 20a to 20c.

Figure 29:
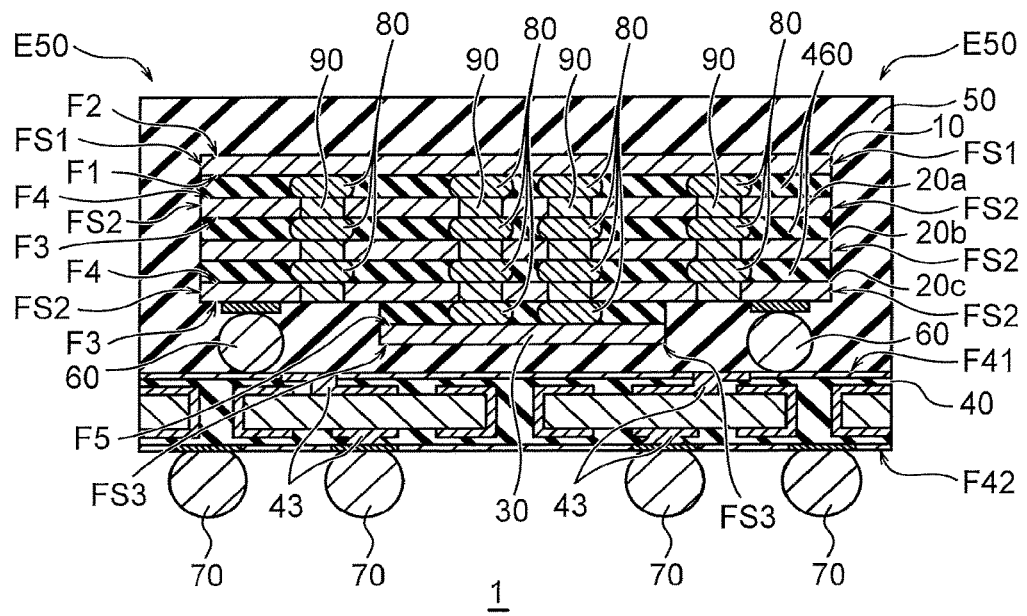

A semiconductor device illustrated in FIG. 29 is a modification in which the third semiconductor chip 30 is further added to the modification illustrated in FIG. 26. In the semiconductor device illustrated in FIG. 29, adjacent ones of the first to third semiconductor chips 10, 20a to 20c, and 30 are bonded together with the resin film 460.

Figure 30:
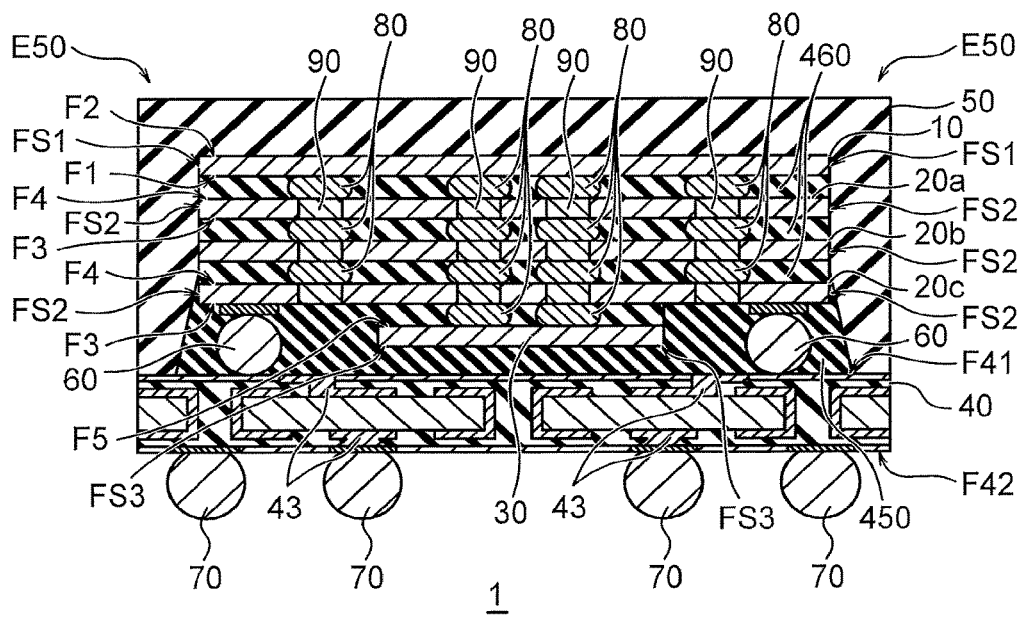

A semiconductor device illustrated in FIG. 30 is a modification in which the third semiconductor chip 30 is further added to the modification illustrated in FIG. 27. In this modification, the resin 450 is applied onto the wiring substrate 40 during mounting of the stacked body illustrated in FIG. 29 on the wiring substrate 40. This enables the stacked body and the wiring substrate 40 to be bonded together with the resin 450 and the adhesiveness between the stacked body and the wiring substrate 40 can be improved.

As for the modification described above, effects identical to those of the first or second embodiment can be achieved.

Third Embodiment

Figure 31:
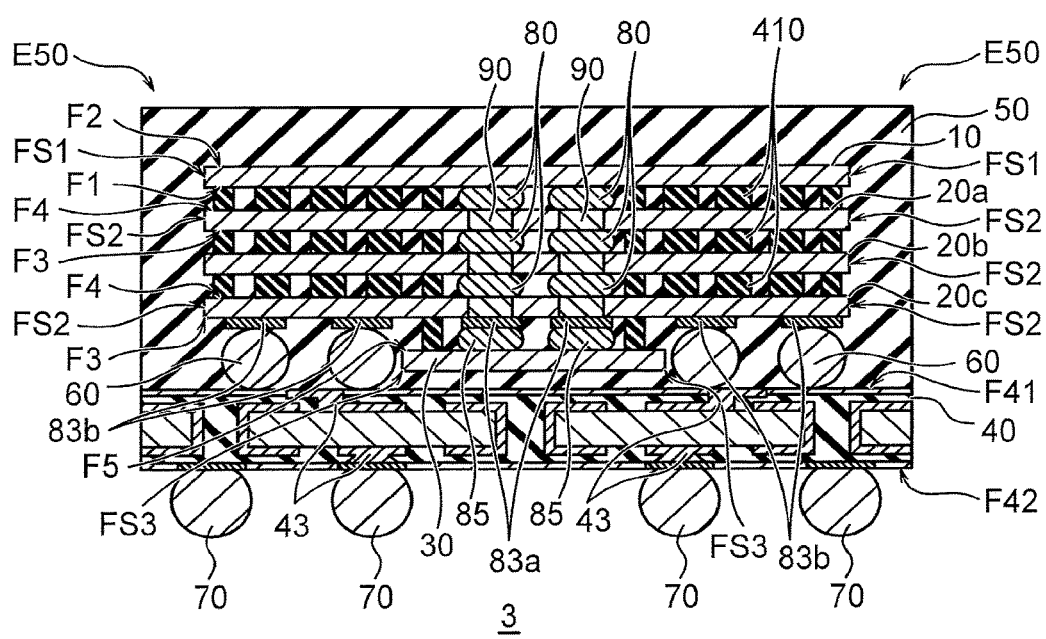
FIG. 31 is a sectional view illustrating an example of a configuration of a semiconductor device according to a third embodiment.
Figure 32A:
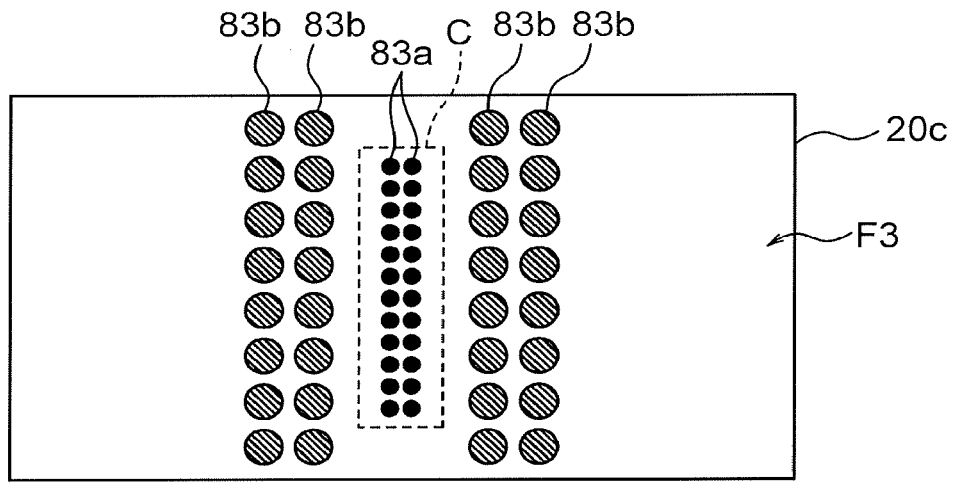
FIGS. 32A and 32B are plan views illustrating an example of a configuration of the second semiconductor chips according to the third embodiment.
Figure 32B:
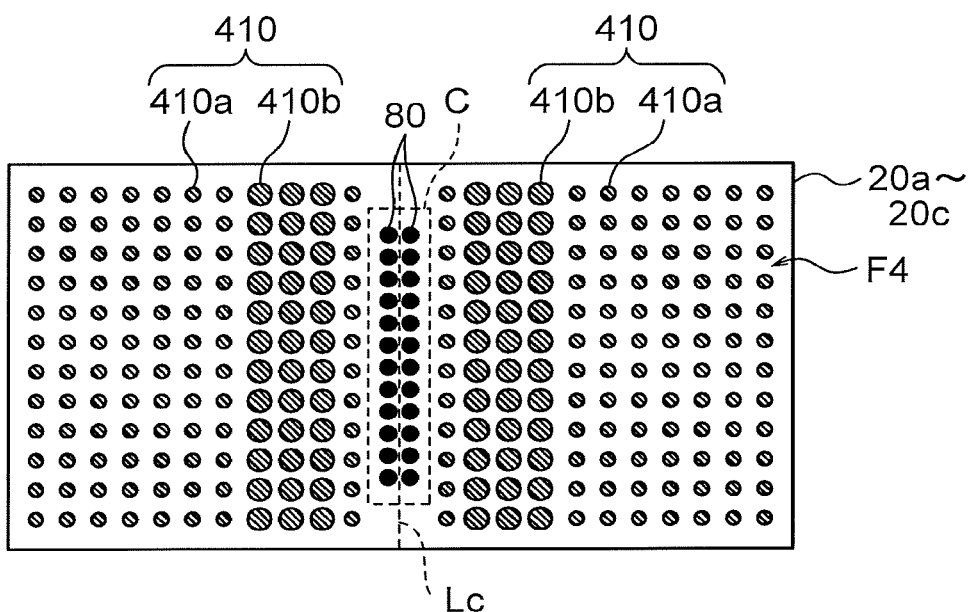

FIG. 31 is a sectional view illustrating an example of a configuration of a semiconductor device according to a third embodiment. FIGS. 32A and 32B are plan views illustrating an example of a configuration of the second semiconductor chips 20a to 20c according to the third embodiment.

A semiconductor device 3 according to the third embodiment includes the adhesive 410 between adjacent ones of the first to third semiconductor chips 10, 20a to 20c, and 30. The adhesive 410 is used to bond adjacent ones of the first to third semiconductor chips 10, 20a to 20c, and 30 together during stacking of the first to third semiconductor chips 10, 20a to 20c, and 30. The adhesive 410 improves the adhesiveness of the stacked body including the first to third semiconductor chips 10, 20a to 20c, and 30. Other constituent elements of the third embodiment can be identical to those of the semiconductor device 2 illustrated in FIG. 14.

As illustrated in FIG. 32A, electrode pads 83a and 83b are provided on the third face F3 of the second semiconductor chip 20c. The electrode pads 83a in a dashed frame C are connected to one ends of the TSVs 90 in FIG. 31 and are provided to correspond to the TSVs 90, respectively. Therefore, although not illustrated in FIG. 32A, the TSVs 90 are provided under the electrode pads 83a, respectively. The electrode pads 83a are, for example, used as power-supply pads. Meanwhile, the electrode pads 83b are electrode pads to be connected to redistribution layers (RDL) (not illustrated). No TSVs 90 are provided under the electrode pads 83b.

As illustrated in FIG. 32B, the metal bumps 80 and the adhesive 410 are provided on the fourth face F4 of each of the second semiconductor chips 20a to 20c. The metal bumps 80 in a dashed frame C are connected to the other ends of the TSVs 90 in FIG. 31 and are provided to correspond to the TSVs 90, respectively. Therefore, the metal bumps 80 are electrically connected to the electrode pads 83a via the TSVs 90, respectively. That is, the dashed frame C indicates a region in which the metal bumps 80 and the TSVs 90 are provided. Because the TSVs 90 are provided in the second semiconductor chips 20a and 20b, the electrode pads 83a are provided on the third faces F3 thereof. However, the electrode pads 83b are not provided on the second semiconductor chips 20a and 20b because no redistribution layers are provided thereon. Although the electrode pads 83b are thus not provided, the second semiconductor chips 20a to 20c are thinned. Accordingly, to prevent distortion of the entire stacked body, the adhesive 410 is provided on the fourth face F4 of each of the second semiconductor chips 20a and 20b similarly to the fourth face F4 of the second semiconductor chip 20c.

The adhesive 410 is provided in a space region (a region other than the dashed frame C) where the metal bumps 80 and the TSVs 90 are not provided on the fourth face F4. The adhesive 410 is, for example, a photosensitive adhesive and is processed into an arbitrary pattern on the fourth face F4 using the lithography technology. The adhesive 410 is placed entirely on the fourth face F4 other than the dashed frame C. The adhesive 410 has adhesives 410a with a relatively small area and adhesives 410b with an area larger than that of the adhesives 410a. The adhesives 410b are placed near the metal bumps 80 and the adhesives 410a are placed in regions far from the metal bumps 80 as illustrated in FIG. 32B. The adhesives 410b with a larger area are placed at a position corresponding to the metal pads 83b in FIG. 32A. That is, the adhesives 410b are provided on the opposite side to the metal pads 83b to enable to receive load applied on the metal pads 83b. On the other hand, the adhesives 410a with a smaller area are provided on the opposite side to a region where the metal pads 83a and 83b are not provided. Accordingly, at the time of bonding adjacent chips in the stacked body including the first and second semiconductor chips 10 and 20a to 20c using a flip chip bonder or the like as illustrated in FIG. 33, gaps between adjacent ones of the first and second semiconductor chips 10 and 20a to 20c are equalized.

Figure 33:
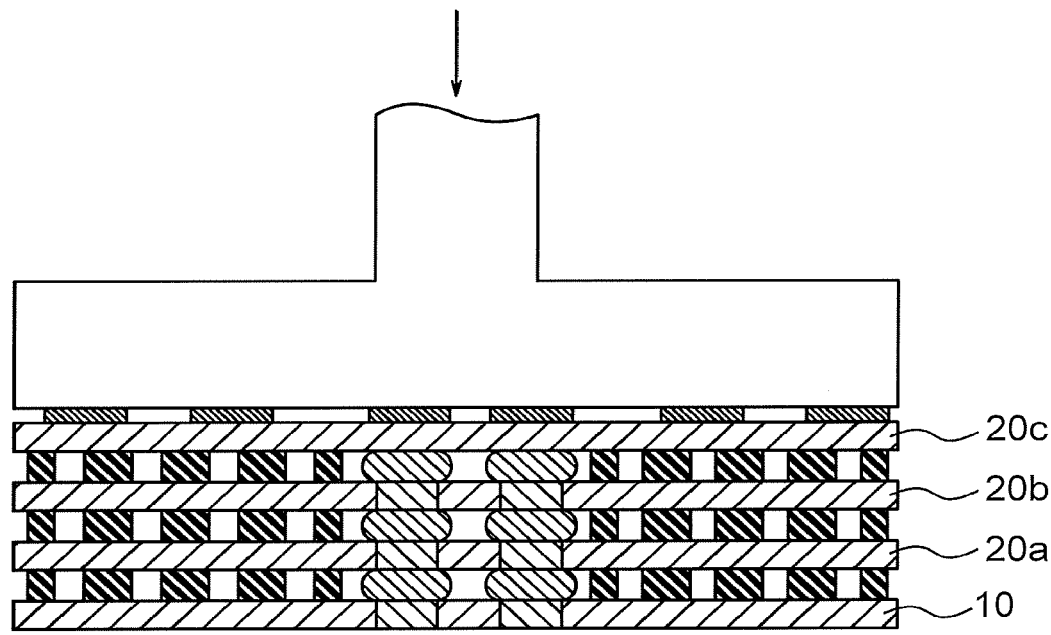
FIG. 33 illustrates a step of stacking the chips.

If the adhesive 410 is not provided on the fourth face F4 opposed to the electrode pads 83 or if the placement area of the adhesive 410 is too small, the adhesive 410 on a face opposed to the electrode pads 83 is squashed more than the metal bumps 80 at a step of stacking the chips using a flip chip bonder illustrated in FIG. 33 and the thickness of the adhesive 410 becomes thinner. If the adhesive 410 is squashed, large load is applied on the metal bumps 80 and a defect of short circuit between the bumps occurs. In this case, during mounting of the semiconductor chips on the wiring substrate 40 in FIG. 31, the adhesive 410 on a face opposed to the electrode pads 83 is squashed, undulation occurs in the semiconductor chips, and there is a possibility that the metal bumps 60 cannot be connected to the metal pads 83a.

On the other hand, according to the third embodiment, the adhesive 410 is placed on a part of the fourth face F4 opposed to the area where the electrode pads 83 are formed, at a higher density and in larger areas than on the other part of the fourth face F4 opposed to the area where the electrode pads 83 are not formed, to equalize gaps between adjacent ones of the first and second semiconductor chips 10 and 20a to 20c. While the density, the placement area, the pattern, and the like of the adhesive 410 differ according to the density, the placement area, and the like of the metal bumps 80, the gaps between adjacent ones of the first and second semiconductor chips 10 and 20a to 20c are equalized at a step of stacking the chips. Accordingly, uneven load is not applied to the metal bumps 80 and the first and second semiconductor chips 10 and 20a to 20c are pressure-welded in a substantially flat state without being distorted. As a result, at the time of mounting the chips on the wiring substrate 40, the metal bumps 60 can be connected to the metal pads 83a more reliably.

The adhesives 410a and 410b are different in the areas. However, the placement densities of the adhesives 410a and 410b can be changed while equalizing the respective areas. That is, the adhesive can be placed at a relatively high density on the opposite side to the metal pads 83b and the adhesive can be placed at a relatively low density on the opposite side to the region where the metal pads 83b are not provided.

Figure 34:
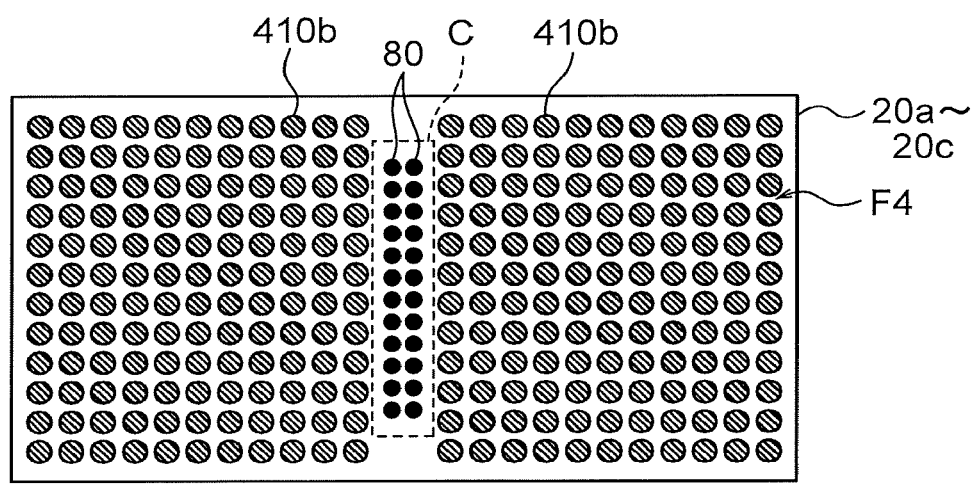
FIG. 34 is a plan view illustrating an example of another configuration of the second semiconductor chips.

As illustrated in FIG. 34, the adhesives 410b can be placed entirely on the fourth face F4 other than the dashed frame C substantially uniformly, for example. Also in this case, the adhesives 410b with a large area support the entire fourth face F4 of each of the second semiconductor chips 20a to 20c. Therefore, distortion of the first and second semiconductor chips 10 and 20a to 20c at the chip stacking step can be suppressed. Although the space area (the region other than the dashed frame C) where the metal bumps 80 and the TSVs 90 are not provided is illustrated, the adhesive 410 can be formed between the metal bumps 80 and the metal bumps 80. Also in this case, the adhesive 410 is placed at a relatively high density on the opposite side to the metal pads 83b and the adhesive 410 is placed at a relatively low density on the opposite side to the region where the metal pads 83b are not provided. The third semiconductor chip can be placed between the second semiconductor chip and the wiring substrate.

First Modification

Figure 35A:
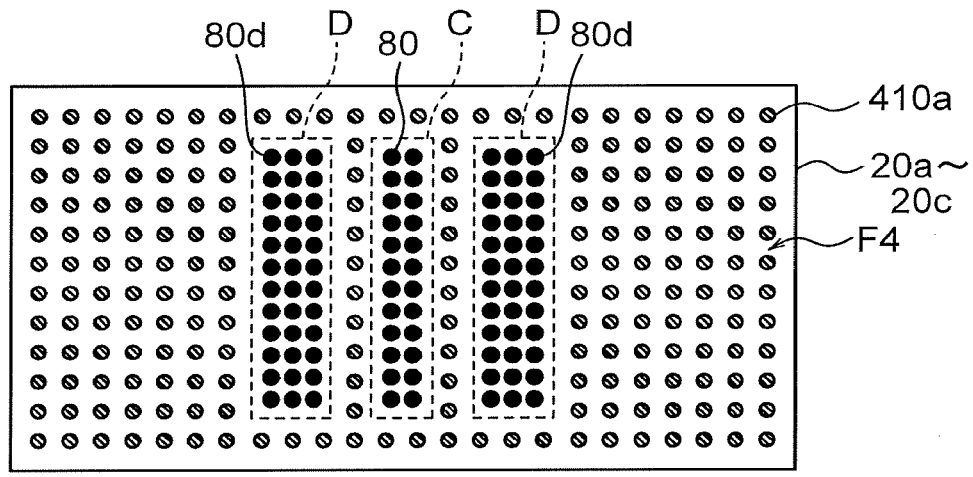
FIG. 35A is a plan view illustrating an example of the configuration of the second semiconductor chips according to a first modification of the third embodiment.

FIG. 35A is a plan view illustrating an example of the configuration of the second semiconductor chips 20a to 20c according to a first modification of the third embodiment. The third face F3 of the second semiconductor chip 20c can be identical to that in the layout illustrated in FIG. 32A.

The present modification is different from the third embodiment in that dummy bumps 80d are further provided on the fourth face F4 of each of the second semiconductor chips 20a to 20c. Other constituent elements of the present modification can be identical to corresponding ones of the third embodiment.

The dummy bumps 80d are provided in two dummy regions (dashed frames) D that are located symmetrically across the dashed frame C in FIG. 35A. The dummy bumps 80d are made of an identical material to that of the metal bumps 80 and can have identical size and shape to those thereof. Meanwhile, the dummy bumps 80d are electrically separated from the TSVs 90 or wires and are in an electrically floating state. Therefore, no TSVs are provided under the dummy bumps 80d.

The dummy bumps 80d are placed at positions corresponding to the metal pads 83b in FIG. 32A similarly to the adhesives 410b in FIG. 32B. That is, the dummy bumps 80d are provided on the opposite side to the metal pads 83b at a higher density or in larger areas than other bump portions to enable to receive load applied on the metal pads 83b. Meanwhile, the adhesives 410a are provided in a region other than the dashed frames C and D. That is, the adhesives 410a are provided on the opposite side to the region where the metal pads 83b are not provided. This equalizes the gaps between adjacent ones of the first and second semiconductor chips 10 and 20a to 20c when the first and second semiconductor chips 10 and 20a to 20c are stacked. Therefore, the first modification can achieve effects identical to those of the third embodiment.

Second Modification

Figure 35B:
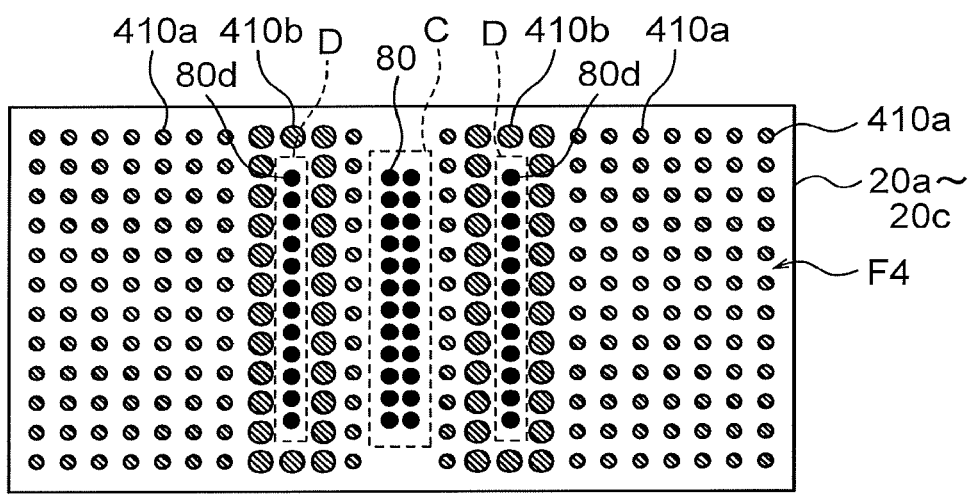
FIG. 35B is a plan view illustrating an example of the configuration of the second semiconductor chips according to a second modification of the third embodiment.

FIG. 35B is a plan view illustrating an example of the configuration of the second semiconductor chips 20a to 20c according to a second modification of the third embodiment. The third face F3 of the second semiconductor chip 20c can be identical to that in the layout illustrated in FIG. 32A.

In FIG. 35B, the dummy bumps 80d are provided in two dummy regions D that are located symmetrically across the dashed frame C. Meanwhile, the adhesives 410b are provided around the dummy bumps 80d. The dummy bumps 80d are formed using the same material as that of the metal bumps 80 and in the same size and shape as those of the metal bumps 80.

The dummy bumps 80d and the adhesives 410b are placed at positions corresponding to the metal pads 83b in FIG. 32B. That is, the dummy bumps 80d and the adhesives 410b are provided at a high density or in large areas on the opposite side to the metal pads 83b to enable to receive load applied to the metal pads 83b. Meanwhile, the adhesives 410a are provided in other regions. That is, the adhesives 410a are provided on the opposite side to the region where the metal pads 83b are not provided. The gaps between adjacent ones of the first and second semiconductor chips 10 and 20a to 20c are thus equalized when the first and second semiconductor chips 10 and 20a to 20c are stacked. Therefore, the second modification can achieve effects identical to those of the third embodiment.

The third embodiment, the first modification, or the second modification can be combined with the first or second embodiment. In this case, the third modification can also achieve effects of the first or second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a wiring substrate;
a first semiconductor chip having a first face, a second face on an opposite side to the first face, and a first side face between an outer edge of the first face and an outer edge of the second face, and the first semiconductor chip being located above the wiring substrate so that the first face faces a surface of the wiring substrate;
a second semiconductor chip having a third face, a fourth face on an opposite side to the third face, a second side face between an outer edge of the third face and an outer edge of the fourth face, and a through electrode passing through at least a semiconductor substrate between the third face and the fourth face, where the second side face has a first portion having more irregularities than the first side face, and the second semiconductor chip being located between the wiring substrate and the first semiconductor chip so that the third face faces the surface of the wiring substrate; and
a resin located around the first and second semiconductor chips.

2. The device of claim 1, wherein the second semiconductor chip further comprises a first metal bump electrically connecting the through electrode to the first semiconductor chip or another second semiconductor chip.

3. The device of claim 2, further comprising a third semiconductor chip having a fifth face, a sixth face on an opposite side to the fifth face, and a third side face between an outer edge of the fifth face and an outer edge of the sixth face, the third semiconductor chip being located between the wiring substrate and the second semiconductor chip so that the fifth face faces the surface of the wiring substrate.

4. The device of claim 2, comprising an adhesive between the first semiconductor chip and the second semiconductor chip.

5. The device of claim 2, comprising an electrode pad on a third face of the second semiconductor chip, where the third face is located on a side of the wiring substrate, and comprising an adhesive between the first semiconductor chip and the second semiconductor chip, wherein
a density of the adhesive on a fourth face opposed to the electrode pad is higher than that in a part of the fourth face corresponding to a part of the third face where no electrode pad is placed.

6. The device of claim 1, further comprising a third semiconductor chip having a fifth face, a sixth face on an opposite side to the fifth face, and a third side face between an outer edge of the fifth face and an outer edge of the sixth face, the third semiconductor chip being located between the wiring substrate and the second semiconductor chip so that the fifth face faces the surface of the wiring substrate.

7. The device of claim 6, comprising an adhesive between the wiring substrate and the second semiconductor chip and between the wiring substrate and the third semiconductor chip.

8. The device of claim 6, comprising an electrode pad on a third face of the second semiconductor chip, where the third face is located on a side of the wiring substrate, and comprising an adhesive between the first semiconductor chip and the second semiconductor chip, wherein
a density of the adhesive on a fourth face opposed to the electrode pad is higher than that in a part of the fourth face corresponding to a part of the third face where no electrode pad is placed.

9. The device of claim 8, wherein
the adhesive on the fourth face comprises
a first adhesive being placed near the electrode pad and having a first area, and
a second adhesive being placed at a position farther from the electrode pad than the first adhesive and having a second area smaller than the first area.

10. The device of claim 1, comprising an adhesive between the first semiconductor chip and the second semiconductor chip.

11. The device of claim 10, further comprising a support body on the second face of the first semiconductor chip.

12. The device of claim 1, further comprising a support body on the second face of the first semiconductor chip.

13. The device of claim 1, comprising an electrode pad on a third face of the second semiconductor chip, where the third face is located on a side of the wiring substrate, and comprising an adhesive between the first semiconductor chip and the second semiconductor chip, wherein
a density of the adhesive on a fourth face opposed to the electrode pad is higher than that in a part of the fourth face corresponding to a part of the third face where no electrode pad is placed.

14. The device of claim 1, wherein
the first side face is a cleavage plane which is a crystal plane of a semiconductor single crystal.

15. The device of claim 14, wherein
the second side face is a modified plane having more irregularities than the cleavage plane.

16. The device of claim 1, wherein
the first condition plane is a mirror plane containing few irregularities.

17. The device of claim 1, wherein
the first side face has a same crystal plane of a semiconductor single crystal, entirely.

* * * * *